US010862018B2

(12) United States Patent
Hada et al.

(10) Patent No.: US 10,862,018 B2
(45) Date of Patent: Dec. 8, 2020

(54) METHOD FOR MANUFACTURING A PIEZOELECTRIC DEVICE

(71) Applicant: Murata Manufacturing Co., Ltd., Nagaokakyo (JP)

(72) Inventors: Takuo Hada, Nagaokakyo (JP); Kansho Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 348 days.

(21) Appl. No.: 15/638,861

(22) Filed: Jun. 30, 2017

(65) Prior Publication Data

US 2017/0309808 A1    Oct. 26, 2017

Related U.S. Application Data

(63) Continuation of application No. PCT/JP2016/050123, filed on Jan. 5, 2016.

(30) Foreign Application Priority Data

Jan. 13, 2015  (JP) ................................. 2015-004083

(51) Int. Cl.
*H04R 17/00* (2006.01)
*H01L 41/09* (2006.01)
(Continued)

(52) U.S. Cl.
CPC .......... *H01L 41/09* (2013.01); *B81C 1/00682* (2013.01); *H01L 41/094* (2013.01);
(Continued)

(58) Field of Classification Search
CPC . H01L 41/094; H01L 41/0973; H01L 41/113; H01L 41/253; H01L 41/33;
(Continued)

(56) References Cited

U.S. PATENT DOCUMENTS 1,913,195 A * 6/1933 Donaldson, Jr. ........ F22B 37/48
                                                                122/382
7,102,467 B2   9/2006 Lutz et al.
(Continued)

FOREIGN PATENT DOCUMENTS

JP    H10-256570 A    9/1998
JP    2002-026007 A   1/2002
(Continued)

OTHER PUBLICATIONS

International Search Report issued in International Application No. PCT/JP2016/050123, dated Apr. 5, 2016 (with English translation).
(Continued)

*Primary Examiner* — Paul D Kim
(74) *Attorney, Agent, or Firm* — Arent Fox LLP

(57) ABSTRACT

A method for manufacturing a piezoelectric device that includes a substrate and a vibration portion that can include a membrane or a beam that is directly or indirectly supported by the substrate and arranged above the substrate. Moreover, the vibration portion includes a piezoelectric layer and the method includes forming the vibration portion and adjusting a resonance frequency of the vibration portion by locally subjecting a region including the vibration portion to heat treatment.

20 Claims, 20 Drawing Sheets

(51) Int. Cl.
    *H01L 41/253*    (2013.01)
    *B81C 1/00*    (2006.01)
    *H01L 41/113*    (2006.01)
    *H01L 41/33*    (2013.01)
    *H04R 17/10*    (2006.01)
    *H04R 31/00*    (2006.01)

(52) U.S. Cl.
    CPC ........ *H01L 41/0973* (2013.01); *H01L 41/113* (2013.01); *H01L 41/253* (2013.01); *H01L 41/33* (2013.01); *H04R 17/10* (2013.01); *H04R 31/006* (2013.01); *B81B 2201/0271* (2013.01); *B81B 2201/032* (2013.01); *H04R 17/00* (2013.01); *H04R 2201/003* (2013.01)

(58) Field of Classification Search
    CPC ...... H04R 17/00; H04R 17/10; H04R 31/006; B81C 1/00682; B81B 2201/0271
    See application file for complete search history.

(56) References Cited

U.S. PATENT DOCUMENTS

| | | | |
|---|---|---|---|
| 7,221,241 | B2 | 5/2007 | Lutz et al. |
| 7,325,452 | B2 | 2/2008 | Takahashi et al. |
| 7,400,078 | B2 * | 7/2008 | Takahashi .......... G01C 19/5783 310/348 |
| 7,578,187 | B2 | 8/2009 | Takahashi et al. |
| 7,592,739 | B2 | 9/2009 | Robert |
| 7,723,905 | B2 * | 5/2010 | Takahashi .......... G01C 19/5783 310/370 |
| 9,525,365 | B2 * | 12/2016 | Katsumura ......... H01L 41/1136 |
| 2005/0028336 | A1 * | 2/2005 | Robert .................... H03H 3/04 29/25.35 |
| 2005/0162040 | A1 | 7/2005 | Robert |
| 2005/0242904 | A1 | 11/2005 | Lutz et al. |
| 2006/0196267 | A1 | 9/2006 | Takahashi et al. |
| 2006/0255881 | A1 | 11/2006 | Lutz et al. |
| 2007/0146439 | A1 * | 6/2007 | Chou .................. B41J 2/14008 347/68 |
| 2008/0080042 | A1 * | 4/2008 | Yang .................. G02B 26/0808 359/297 |
| 2008/0083278 | A1 | 4/2008 | Takahashi et al. |
| 2010/0134209 | A1 * | 6/2010 | Gabl .................... G01N 29/022 333/187 |
| 2010/0195851 | A1 | 8/2010 | Buccafusca et al. |
| 2010/0245488 | A1 * | 9/2010 | Li ........................ B41J 2/161 347/68 |
| 2017/0069821 | A1 * | 3/2017 | Mouri .................... H01L 41/04 |

FOREIGN PATENT DOCUMENTS

| | | | |
|---|---|---|---|
| JP | 2005-528010 | A | 9/2005 |
| JP | 2007-024862 | A | 2/2007 |
| JP | 2008103796 | A * | 5/2008 |
| JP | 2011-211741 | A | 10/2011 |

OTHER PUBLICATIONS

S. Shelton et al., CMOS-Compatible AlN Piezoelectric Micromachined Ultrasonic Transducers, 2009, IEEE International Ultrasonics Symposium Proceedings, pp. 402-405.

Written Opinion of the International Searching Authority issued in International Application No. PCT/JP2016/050123, dated Apr. 5, 2016 (with English translation).

* cited by examiner

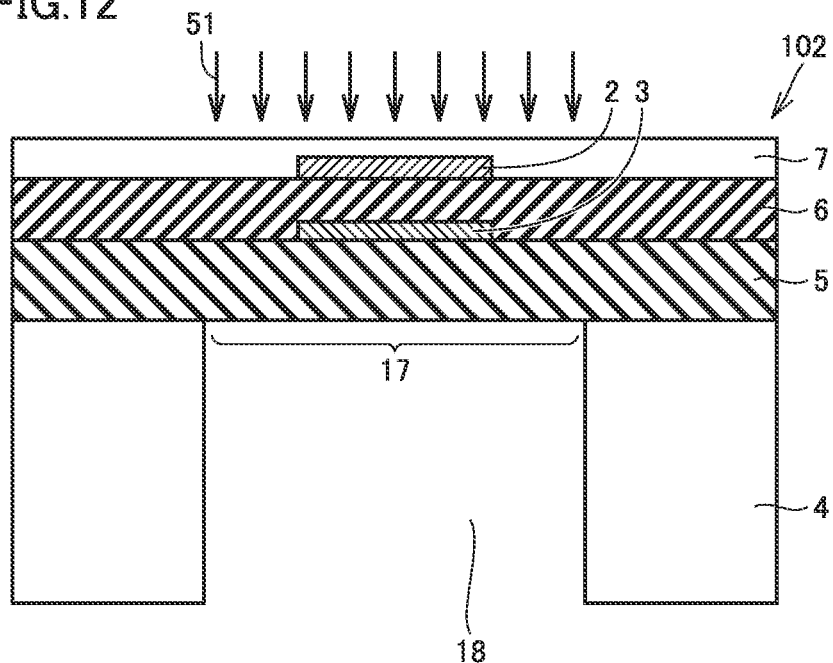
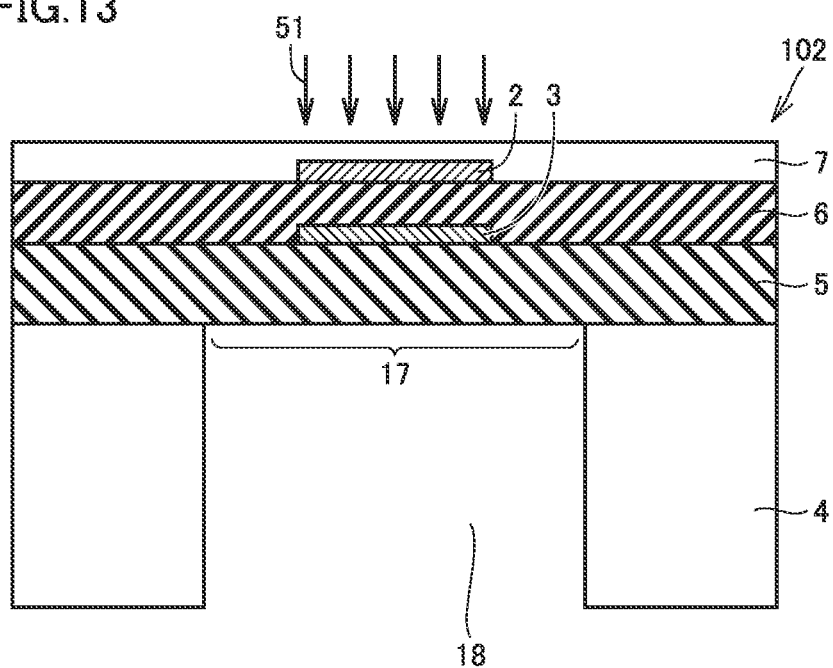

METHOD FOR MANUFACTURING A PIEZOELECTRIC DEVICE

CROSS REFERENCE TO RELATED APPLICATIONS

The present application is a continuation of PCT/JP2016/050123 filed Jan. 5, 2016, which claims priority to Japanese Patent Application No. 2015-004083, filed Jan. 13, 2015, the entire contents of each of which are incorporated herein by reference.

TECHNICAL FIELD

The present disclosure relates to a method for manufacturing a piezoelectric device.

BACKGROUND

As disclosed in "CMOS-Compatible AlN Piezoelectric Micromachined Ultrasonic Transducers," Stefon Shelton et al., 2009 IEEE International Ultrasonics Symposium Proceedings, pp. 402-405 (hereinafter "non-patent document 1"), a piezoelectric device including a substrate and a piezoelectric layer and an electrode that are provided above the substrate is known. Such a piezoelectric device can be used, for example, for a filter, an actuator, a sensor, and a pMUT (piezoelectric Micromachined Ultrasonic Transducers).

U.S. Patent Publication No. 2010/0195851A1 (hereinafter "patent document 1") discloses in paragraphs 0017 to 0023 and FIGS. 1A and 1B, a MEMS device including a transducer, a substrate, and a temperature compensating element as one example of such a piezoelectric device. The transducer is, for example, a piezoelectric ultrasonic transducer which vibrates in a flexural mode and is arranged above the substrate. The temperature compensating element is, for example, a heater element, and it is arranged on the substrate around the transducer on a lower surface side thereof.

Such a piezoelectric device is disadvantageous in great variation in resonance frequency (hereinafter also referred to as "frequency variation") caused during manufacturing. There are some factors determining frequency variation such as a dimension including a thickness and a length of the device. In particular, the most important factor is a stress in a member forming a membrane portion. A member forming the membrane portion includes a piezoelectric layer and an electrode.

A stress in the member forming the membrane portion may vary depending on a manufacturing method such as a sputtering method or a sol-gel method. A piezoelectric layer composed of AlN is often formed with the sputtering method. When the piezoelectric layer composed of AlN is formed with the sputtering method, a stress in the piezoelectric layer may greatly vary in a wafer plane due to a temperature distribution in a substrate or a plasma distribution. Consequently, frequency variation of the piezoelectric device is great.

Japanese Patent Laying-Open No. 10-256570 (hereinafter "patent document 2") discloses in paragraphs 0018 to 0032 formation of a thin film formed of a piezoelectric material while a substrate is heated with a heater as a local heating layer formed on the substrate in order to form a thin film excellent in characteristics in a thin-film device.

Japanese Patent Laying-Open No. 2002-26007 (hereinafter "patent document 3") describes in paragraphs 0012 to 0013 adjustment of a resonance frequency of a thin-film structure by controlling an internal stress. Moreover, according to paragraphs 0040 to 0051 of this document, a silicon nitride film which is a part of a silicon nitride thin-film structure is formed at a substrate temperature not higher than 400° C. with a plasma CVD method. Further, according to paragraphs 0052 to 0056, the silicon nitride film of the silicon nitride thin-film structure is subjected to heat treatment at a temperature not higher than 400° C. in vacuum. In addition, paragraphs 0057 to 0059 described how the silicon nitride film of the silicon nitride thin-film structure is subjected to heat treatment also with irradiation with laser.

Japanese Patent Laying-Open No. 2011-211741 (hereinafter "patent document 4") describes a method for adjusting a resonance frequency of a MEMS resonator. According to paragraphs 0015, 0027, 0035, 0043, and 0046 of this document, a beam structure composed of polycrystalline silicon is subjected to resistance heating to thereby alter or remove a material for the beam structure. According to this document, a resonance frequency of the MEMS resonator is adjusted by thus altering or removing a material.

A temperature distribution in a substrate or a plasma distribution in the sputtering method affects magnitude of a stress in a piezoelectric layer composed of AlN. Therefore, great variation in resonance frequency caused during manufacturing is not necessarily overcome simply by adopting the method for manufacturing a thin film described in patent document 2.

Moreover, patent document 3 fails to mention a film (a layer) other than the silicon nitride film, and in addition, with the method described in patent document 3, a wiring material such as Al is disadvantageously molten or diffused in the substrate during the heat treatment at a high temperature exceeding 400° C. Therefore, the method described in patent document 3 is not suitable for heat treatment at a temperature exceeding 400° C.

The method for adjusting a resonance frequency of a MEMS resonator described in patent document 4 aims to change a resonance frequency by altering and/or removing a material for a beam structure, and therefore, an amount of change in resonance frequency is small and a range of adjustment is limited. The method described in patent document 4 is insufficient in amount of change for achieving actually necessary adjustment.

SUMMARY

An object of the present disclosure is to provide a method for manufacturing a piezoelectric device that achieves less variation in resonance frequency caused during manufacturing.

In order to achieve the object, a method for manufacturing a piezoelectric device is described in which the piezoelectric device includes a substrate and a vibration portion in a form of a membrane or a beam that is directly or indirectly supported by the substrate and arranged above the substrate. Moreover, the vibration portion includes a piezoelectric layer, and the method includes forming the vibration portion and adjusting a resonance frequency of the vibration portion by locally subjecting a region including at least a part of the vibration portion to heat treatment.

In an exemplary aspect, preferably, in the adjusting a resonance frequency, a stress in the vibration portion is adjusted through the heat treatment.

In an exemplary aspect, preferably, in the forming the vibration portion, the vibration portion is formed to include a residual stress displaced toward a tensile stress relative to a value for a residual stress corresponding to a target value for the resonance frequency, and in the adjusting a resonance frequency, an amount of residual stress in the vibration portion is varied toward a compressive stress through the heat treatment.

In an exemplary aspect, preferably, the vibration portion includes a heater and the adjusting a resonance frequency is performed by driving the heater.

In an exemplary aspect, preferably, the adjusting a resonance frequency is performed by irradiating at least a part of the vibration portion with laser beams.

In an exemplary aspect, preferably, in forming the vibration portion, a light reception portion for receiving the laser beams is formed in the vibration portion, and in irradiation with the laser beams, the laser beams are emitted toward the light reception portion.

In an exemplary aspect, preferably, measuring a resonance frequency of the vibration portion is included, and the heat treatment is performed based on a result of measurement in the measuring a resonance frequency.

In an exemplary aspect, preferably, measuring again a resonance frequency after the adjusting a resonance frequency is included.

In an exemplary aspect, preferably, the vibration portion includes a lower electrode arranged under the piezoelectric layer and an upper electrode arranged above the piezoelectric layer as being opposed to at least a part of the lower electrode with the piezoelectric layer being interposed in the vibration portion, and a protective film is provided to cover the upper electrode and the piezoelectric layer.

In an exemplary aspect, preferably, the substrate is provided with a through hole or a recess and includes a support layer so as to at least partially cover the through hole or the recess. Moreover, the piezoelectric layer of the vibration portion is preferably supported by the substrate with the support layer being interposed.

In an exemplary aspect, preferably, the piezoelectric layer is mainly composed of any selected from the group consisting of AlN, KNN, and PZT.

In an exemplary aspect, preferably, the lower electrode and the upper electrode are mainly composed of W or Mo.

In an exemplary aspect, preferably, the protective film is mainly composed of any selected from the group consisting of AlN, Si, and SiN.

In an exemplary aspect, preferably, the support layer is mainly composed of any selected from the group consisting of AlN, Si, and SiN.

According to the present disclosure, a resonance frequency of a vibration portion can be adjusted by locally subjecting a region including at least a part of the vibration portion to heat treatment so that the resonance frequency of the vibration portion is proper. Therefore, variation in resonance frequency caused during manufacturing can be reduced.

BRIEF DESCRIPTION OF DRAWINGS

FIG. 12 is a cross-sectional view along the line XII-XII in FIG. 11.

FIG. 13 is an illustrative diagram showing one example of a way of irradiation with laser beams in the method for manufacturing a piezoelectric device in an exemplary embodiment 2.

DETAILED DESCRIPTION

Embodiment 1

Figure 1:
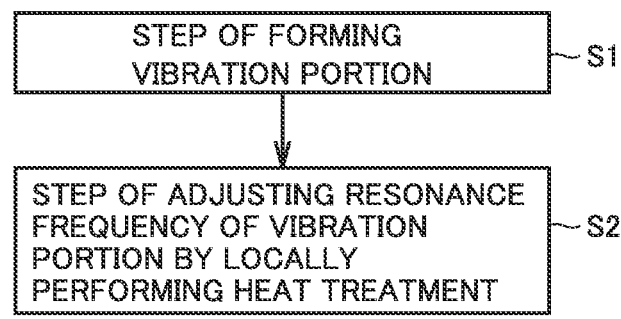
FIG. 1 is a flowchart of a method for manufacturing a piezoelectric device in an exemplary embodiment 1.

A method for manufacturing a piezoelectric device in an exemplary Embodiment 1 will be described with reference to FIGS. 1 to 8. Specifically, FIG. 1 shows a flowchart of a method for manufacturing a piezoelectric device according to the exemplary embodiment.

The method for manufacturing a piezoelectric device in the present embodiment is a method for manufacturing a piezoelectric device including a substrate and a vibration portion in a form of a membrane or a beam that is directly or indirectly supported by the substrate and arranged above the substrate. Moreover, the vibration portion includes a piezoelectric layer, and the method includes a step S1 of forming the vibration portion and a step S2 of adjusting a resonance frequency of the vibration portion by locally subjecting a region including at least a part of the vibration portion to heat treatment. Preferably, in step S2 of adjusting a resonance frequency, a stress in the vibration portion is adjusted through heat treatment.

Figure 2:
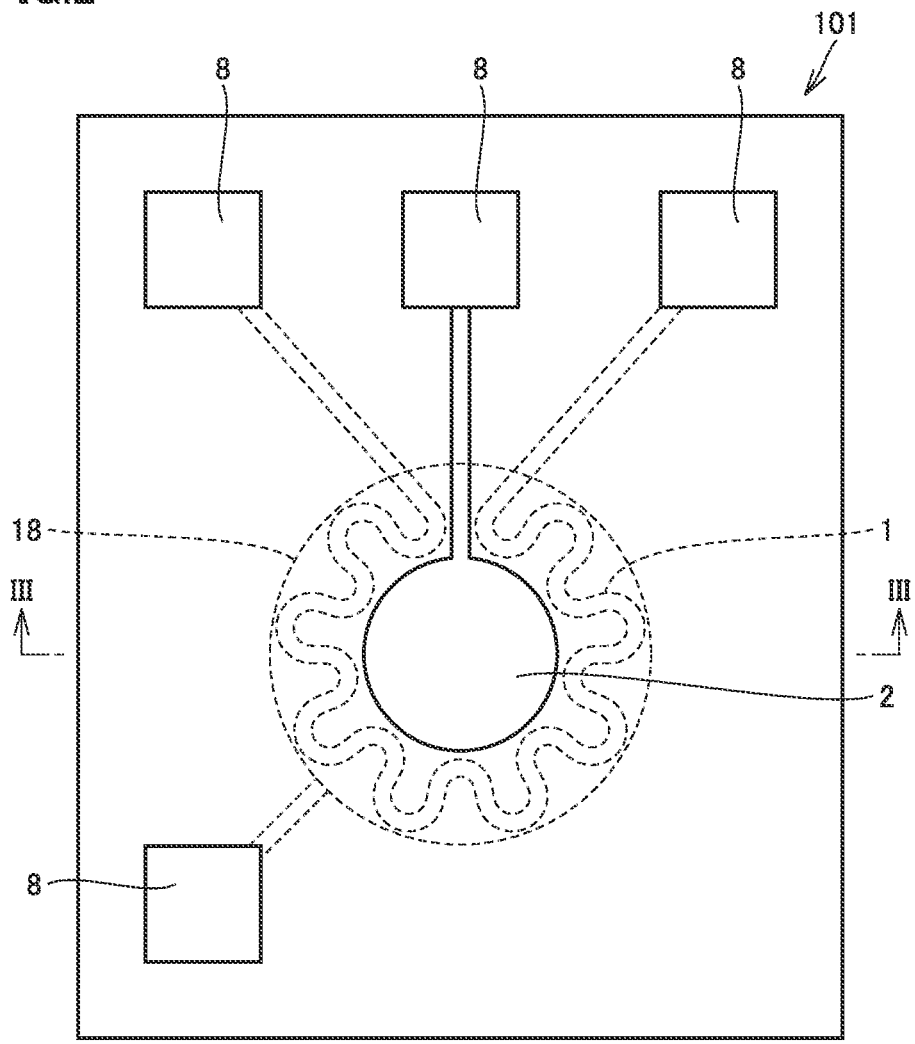
FIG. 2 is a plan view of a piezoelectric device manufactured with the method for manufacturing a piezoelectric device in an exemplary embodiment 1.
Figure 3:
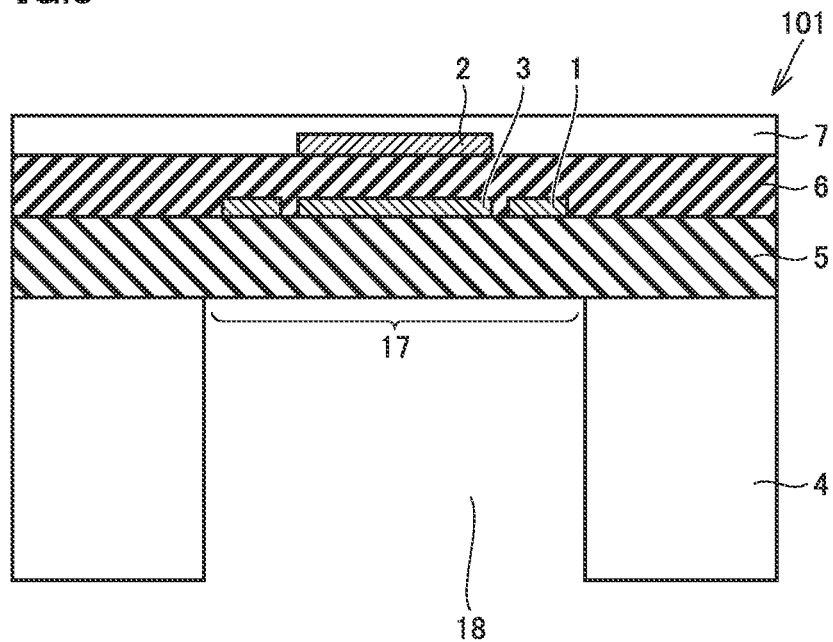
FIG. 3 is a cross-sectional view along the line in FIG. 2.

FIGS. 2 and 3 show one example of a piezoelectric device manufactured with the method for manufacturing a piezoelectric device in the present embodiment. In particular, FIG. 2 is a plan view and FIG. 3 is a cross-sectional view along the line III-III in FIG. 2. For the sake of convenience of illustration, FIG. 2 shows a state with a protective film 7 having been removed. Even while protective film 7 is provided, protective film 7 is provided with an opening over each pad portion 8 and electrical connection to pad portion 8 can be established even from above protective film 7. A membrane portion 17 serves as a vibration portion in a piezoelectric device 101 manufactured in the present embodiment.

Preferably, piezoelectric device 101 is used, for example, as a pMUT. In the method for manufacturing a piezoelectric device in the present embodiment, each step below for manufacturing piezoelectric device 101 is performed.

Figure 4:
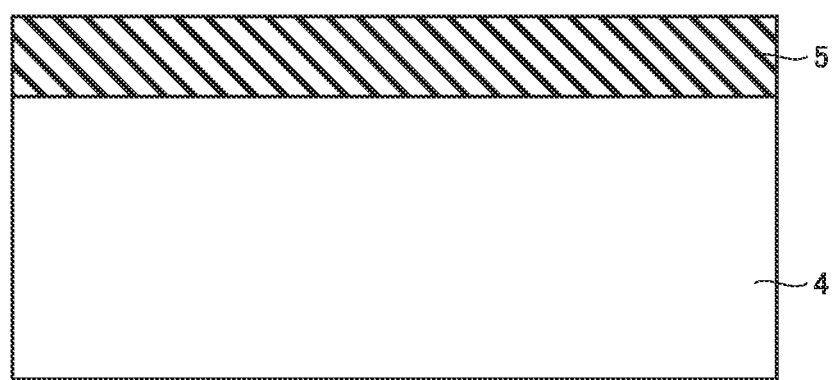
FIG. 4 is a diagram illustrating a first step in the method for manufacturing a piezoelectric device in an exemplary embodiment 1.
Figure 5:
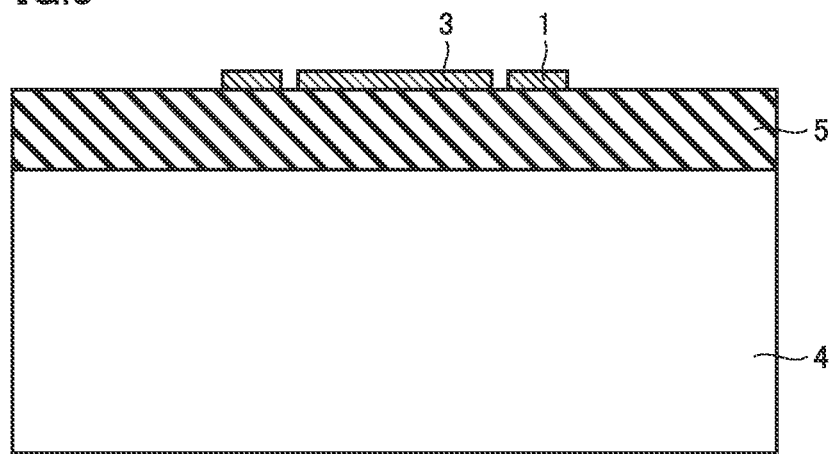
FIG. 5 is a diagram illustrating a second step in the method for manufacturing a piezoelectric device in an exemplary embodiment 1.
Figure 6:
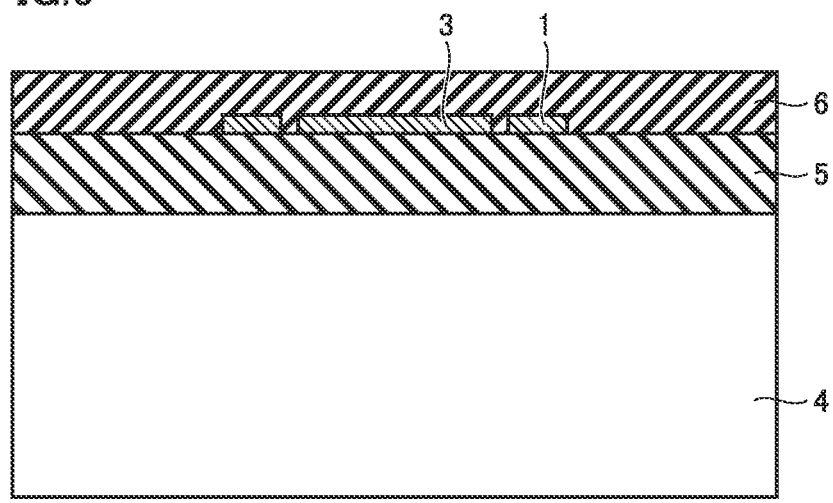
FIG. 6 is a diagram illustrating a third step in the method for manufacturing a piezoelectric device in an exemplary embodiment 1.
Figure 7:
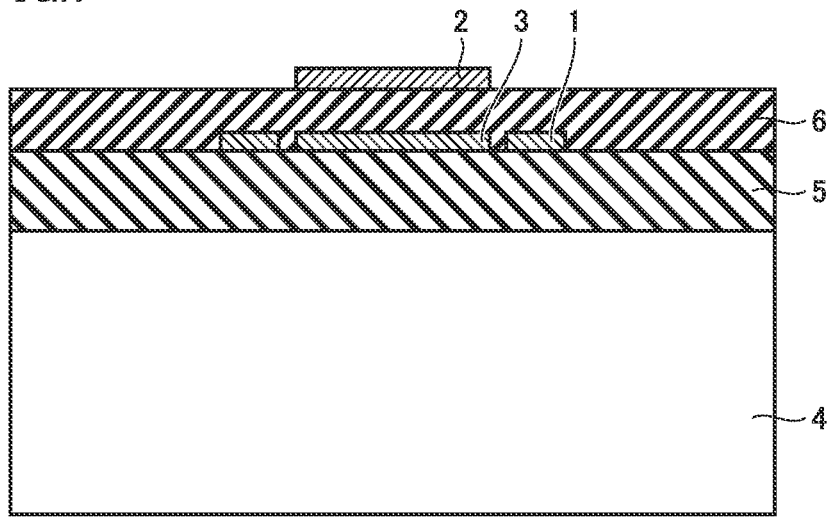
FIG. 7 is a diagram illustrating a fourth step in the method for manufacturing a piezoelectric device in an exemplary embodiment 1.
Figure 8:
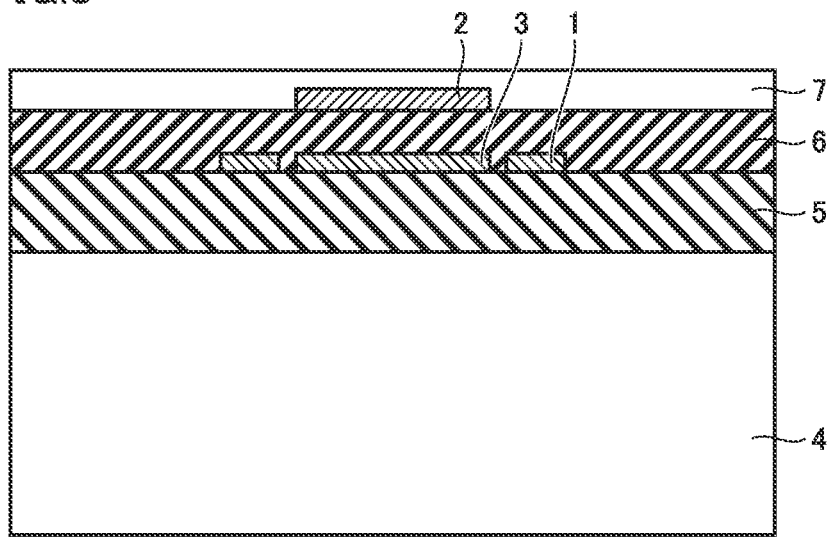
FIG. 8 is a diagram illustrating a fifth step in the method for manufacturing a piezoelectric device in an exemplary embodiment 1.

Step S1 of forming the vibration portion is initially performed and includes the steps described below. As shown in FIG. 4, an AlN film as a support layer 5 is formed with the sputtering method to a thickness not smaller than 500 nm and not greater than 3000 nm on a silicon substrate as a substrate 4. In succession, a molybdenum film is formed to a thickness not smaller than 100 nm and not greater than 200 nm to cover an upper surface of support layer 5 and the molybdenum film is patterned. Thus, as shown in FIG. 5, a heater 1 and a drive-and-reception lower electrode 3 are formed. Heater 1 is formed in a meandering shape so as to surround drive-and-reception lower electrode 3. In succession, as shown in FIG. 6, an AlN film to be a piezoelectric layer 6 is formed with the sputtering method to a thickness not smaller than 500 nm and not greater than 3000 nm and patterned as necessary. In succession, as shown in FIG. 7, a molybdenum film is formed and patterned. Thus, a drive-and-reception upper electrode 2 is formed. In succession, an AlN film to be protective film 7 is formed to a thickness not smaller than 100 nm and not greater than 1000 nm. According to the claimed method, a structure is obtained as shown in FIG. 8.

In forming an AlN film or a molybdenum film as an electrode as shown above, a stress in a formed film has an in-plane distribution because there is a temperature distribution in substrate 4 and a plasma density during sputtering has a distribution over a surface of the substrate. This distribution generally exhibits an in-plane difference not lower than 100 MPa. When a formed film is assumed to have a stress of 100 MPa, a resonance frequency of an element which exhibits out-of-plane vibration like a pMUT is varied because a membrane is compressed or pulled under the influence by the stress. For example, even though a resonance frequency is designed to be 300 kHz, the resonance frequency will vary, for example, from 250 kHz to 500 kHz in the plane.

In succession, protective film 7 and piezoelectric film 6 are etched to expose an electrode in a portion to be pad portion 8. In a portion where an electrode is exposed as pad portion 8 (not shown), an aluminum film is formed to cover the electrode.

In succession, substrate 4 is etched from a rear surface of substrate 4 until support layer 5 is reached. A structure shown in FIGS. 2 and 3 is thus obtained. In other words, a through hole 18 is provided in substrate 4 and a portion which remains above through hole 18 serves as membrane portion 17. The procedure thus far corresponds to step S1 of forming the vibration portion. The membrane portion 17 is formed as the vibration portion according to the exemplary aspect.

Until this time point, however, the piezoelectric device has great variation in stress and consequently great frequency variation in each formed layer as described above.

In succession, step S2 of adjusting a resonance frequency of the vibration portion by locally performing heat treatment is performed. Specifically, pad portion 8 connected to heater 1 is used to feed electric power to heater 1, which causes meandering heater 1 to generate heat. Local heat treatment of membrane portion 17 is performed with this heat generation. This heat treatment can also be considered an "annealing treatment." Since heater 1 is extremely low in thermal capacity, local heating to 500° C. to 900° C. or to 900° C. or higher can rapidly be achieved in an extremely short period of time, for example, less than one second once electric power approximately from 100 mW to 1000 mW is fed. A target temperature is set to a temperature not lower than a film formation temperature in sputtering for film formation, preferably a temperature not lower than 900° C. As such heat treatment ends, piezoelectric device 101 of which resonance frequency has been adjusted is obtained.

In the present embodiment, membrane portion 17 is subjected to local heat treatment by feeding electric power to heater 1 to generate heat. By heating membrane portion 17 to a film formation temperature or higher, crystallinity of an AlN film or an Mo film is improved. Specifically, an Ar gas taken in as an impurity in the film is released from the film, or atoms of Al or Mo located between lattices are re-arranged to appropriate positions. A shape as a membrane has already been achieved also in a process for cooling after heat treatment, and hence a thermal stress between the membrane portion and substrate 4 is not much applied and consequently a pMUT having greatly improved initial frequency variation can be fabricated.

Since the manufacturing method in the present embodiment includes the step of adjusting a resonance frequency of the vibration portion by locally subjecting a region including at least a part of the vibration portion to heat treatment as described above, the desired resonance frequency of the vibration portion can be obtained. Therefore, variation in resonance frequency caused during manufacturing can be reduced. Though the entire vibration portion is preferably subjected to heat treatment, the entire vibration portion does not necessarily have to be subjected to heat treatment. In heat treatment, a portion other than the vibration portion may also simultaneously be subjected to heat treatment. For the entire piezoelectric device, however, heat treatment is basically local.

Since heating is performed with heater 1 formed in membrane portion 17 in the present embodiment, a thermal capacity is low and heat treatment can be performed in an extremely short period of time. In addition, a resonance frequency can be adjusted through heat treatment in a form as a final product or in a state close thereto in the present embodiment. Since local heating can be performed in the present embodiment, a desired location can properly be subjected to local heat treatment even though a material low in heat resistance such as an aluminum alloy in pad portion 8 or an adhesive used for die-bonding is located nearby.

Though a heater is used for local heat treatment in the present embodiment, a method of heat treatment is not limited as such. As shown in the present embodiment, preferably, the vibration portion includes a heater, and step S2 of adjusting a resonance frequency is performed by driving the heater. By thus using the heater, a desired portion can readily and reliably selectively be subjected to heat treatment.

Figure 9:
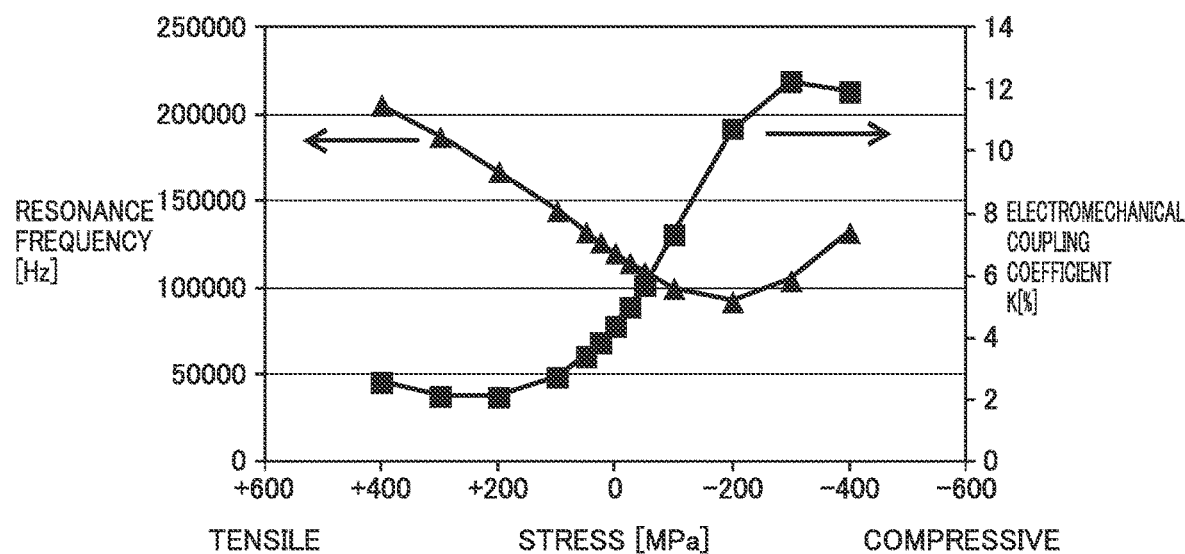
FIG. 9 shows a graph showing a result of calculation of relation between an internal stress in a film and a resonance frequency and relation between an internal stress in a film and an electromechanical coupling coefficient K.

FIG. 9 shows a result of calculation of relation between an internal stress in a film and a resonance frequency and relation between an internal stress in a film and an electromechanical coupling coefficient K. A triangular dot represents a resonance frequency which should be read along the left ordinate. A square dot represents electromechanical coupling coefficient K which should be read along the right ordinate. A greater electromechanical coupling coefficient K is preferred.

As can be read from the graph, a resonance frequency is lowest at a point slightly on a side of a compressive stress relative to a stressless state, that is, a state of a stress of 0 MPa (hereinafter also referred to as a "zero stress"). It can be seen that, with the lowest point being defined as the boundary, the resonance frequency increases both on a tensile side and on a compressive side of this point.

It can be seen in the graph in FIG. 9 that electromechanical coupling coefficient K attains to the maximum at a point displaced toward the compressive side relative to the zero stress state.

Figure 10:
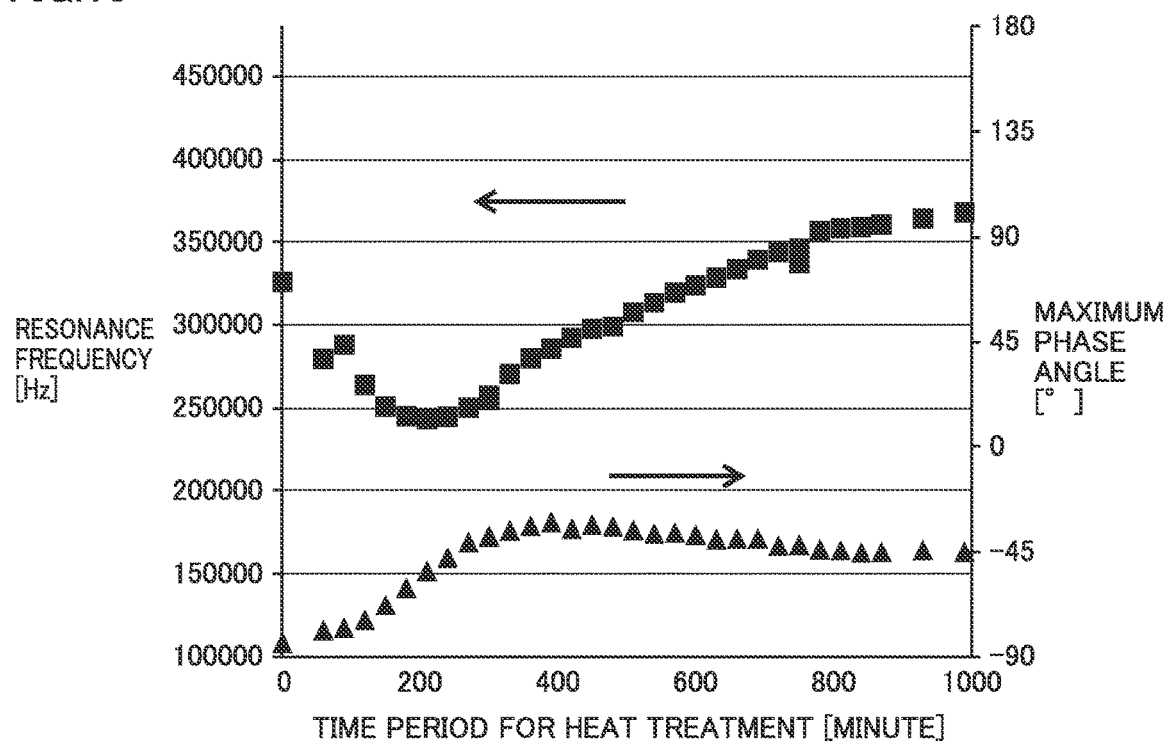
FIG. 10 shows a graph showing a result of calculation of relation between a time period for heat treatment and a resonance frequency and relation between a time period for heat treatment and a maximum phase angle.

FIG. 10 shows a result of calculation of relation between a time period for heat treatment and a resonance frequency and relation between a time period for heat treatment and a maximum phase angle. A rectangular dot represents a resonance frequency which should be read along the left ordinate. A triangular dot represents a maximum phase angle which should be read along the right ordinate. A greater maximum phase angle is preferred. A maximum phase angle of +90° is most preferred. When a maximum phase angle is negative, a smaller absolute value is preferred.

The following can be seen from the graph in FIG. 10. In a piezoelectric device initially on the tensile side, as an internal stress varies toward the compressive side through heat treatment, the resonance frequency initially decreases. Then, with a portion around a point of zero stress being defined as the boundary, the resonance frequency starts to increase. As heat treatment continues, a maximum phase angle also gradually increases. It can thus be seen that resonance characteristics are also improved by performing heat treatment longer. This phenomenon can be explained as follows.

The membrane portion initially in a tensile state is considerably constrained by a tensile stress and less likely to be displaced. As a stress decreases, however, the membrane portion tends to be displaced. When the stress exceeds a point of stress 0 and attains to a value on the side of compressive stress, the membrane portion in turn deforms and is convex upward or downward. A resonance frequency seems to have increased owing to such a shape.

As set forth above, a device formed on the side of tensile stress is subjected to heat treatment to vary from the zero stress toward the compressive side so that adjustment to a desired frequency can be made and resonance characteristics can be improved. Improvement in resonance characteristics here means increase in electromechanical coupling coefficient K and increase in maximum phase angle.

Preferably, in step S1 of forming the vibration portion, the vibration portion is formed to include a residual stress displaced toward tensile stress relative to a value for a residual stress corresponding to a target value for a resonance frequency. In addition, in step S2 of adjusting a resonance frequency, an amount of residual stress in the vibration portion is varied toward the compressive stress through heat treatment. With attention being paid to the curve of the resonance frequency in FIG. 9, an amount of stress is preferably varied from a high portion on the left toward a low portion on the right. Variation by a desired width in such a direction can be achieved by determining a length of a time period for heat treatment with reference to FIG. 10. By adopting this method, a piezoelectric device having a desired resonance frequency can be obtained.

In piezoelectric device 101 manufactured with the manufacturing method in the present embodiment, preferably, the vibration portion includes drive-and-reception lower electrode 3 as a lower electrode arranged under piezoelectric layer 6 and drive-and-reception upper electrode 2 as an upper electrode arranged above piezoelectric layer 6 as being opposed to at least a part of the lower electrode with piezoelectric layer 6 being interposed in the vibration portion, and protective film 7 is provided to cover the upper electrode and piezoelectric layer 6. With protective film 7 being thus provided, piezoelectric layer 6 is protected against oxidation during heat treatment due to electric power feed and reliability can be enhanced.

In piezoelectric device 101 manufactured with the manufacturing method in the present embodiment, preferably, substrate 4 is provided with a through hole or a recess and includes support layer 5 so as to at least partially cover the through hole or the recess. Moreover, piezoelectric layer 6 in the vibration portion is supported by substrate 4 with support layer 5 being interposed therebetween. With support layer 5 thus being interposed, strength of the vibration portion can be increased.

As shown in the present embodiment, an electrode for driving and reception and an electrode for a heater, that is, a heater electrode, can separately be provided. According to this configuration, a function for driving and reception as a pMUT and a function as a heater can independently be used by separate electrodes.

According to the configuration of the piezoelectric device shown in the present embodiment, in membrane portion 17, heater 1 and an electrode for driving and reception as a pMUT are arranged at separate positions and do not interfere with each other.

Though one piezoelectric device may be capable of both of transmission and reception, it should be appreciated that separate piezoelectric devices for transmission and reception may be prepared as one pair of piezoelectric devices as a transmission piezoelectric device and a reception piezoelectric device. In this case, variation in sensitivity in this pair gives rise to a problem. Variation in resonance frequency, however, is lessened by performing heat treatment in the present embodiment, and therefore variation in sensitivity in the pair can also be lessened.

Embodiment 2

Figure 11:
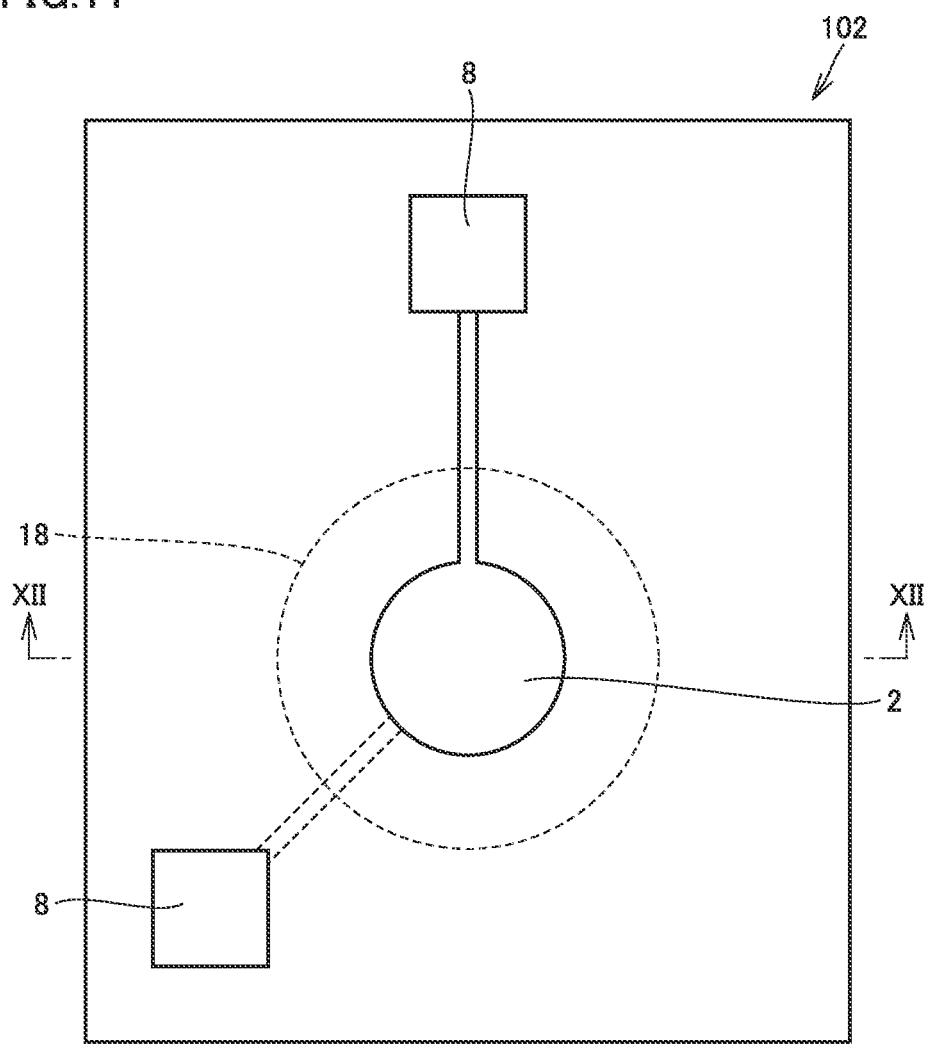
FIG. 11 is a plan view of a piezoelectric device manufactured with a method for manufacturing a piezoelectric device in another exemplary embodiment 2.

A method for manufacturing a piezoelectric device in Embodiment 2 will be described with reference to FIGS. 11 and 12. A flowchart of the method for manufacturing a piezoelectric device in the present embodiment is the same as in FIG. 1. FIGS. 11 and 12 show one example of a piezoelectric device manufactured with the method for manufacturing a piezoelectric device in the present embodiment. FIG. 11 is a plan view of a piezoelectric device 102 and FIG. 12 is a cross-sectional view along the line XII-XII in FIG. 11. Though the method for manufacturing a piezoelectric device in the present embodiment is basically the same as described in Embodiment 1, it is different in points below.

In the present embodiment, step S2 of adjusting a resonance frequency is performed by irradiating at least a part of the vibration portion with laser beams. FIG. 12 shows irradiation with laser beams 51 by way of example. Preferably, the entire membrane portion 17 as the vibration portion in piezoelectric device 102 is irradiated with laser beams 51. Though not only an inner side of membrane portion 17 but also a portion other than membrane portion 17 may be irradiated with laser beams 51, it is irradiation of membrane portion 17 that is actually needed. It is noted that the entire membrane portion 17 does not have to fully be irradiated with laser beams 51 and such irradiation of an area as allowing heat treatment resulting from irradiation with laser to extend over the entire membrane portion 17 as the vibration portion will suffice.

As irradiation with laser beams is performed in the present embodiment, a temperature of a portion irradiated with laser beams increases so that heat treatment is performed. An effect the same as described in Embodiment 1 can be obtained also by subjecting the vibration portion to heat treatment with such a method.

Though substantially the entire membrane portion 17 is irradiated with laser beams 51 in the example shown in FIG. 12, a main material for membrane portion 17 may be transparent and the membrane portion may be less likely to absorb laser beams 51. In such a case, as shown in FIG. 13, a film pattern of any component such as drive-and-reception upper electrode 2 may be formed of an opaque material and only an area where such an opaque film pattern is present may be irradiated with laser beams 51. Molybdenum highly resistant to heat is preferably employed as the opaque material. When a transparent portion is irradiated with laser beams 51, an absorptance is poor and efficiency in heat treatment of the vibration portion is poor. By irradiating a region where an opaque film pattern is present with laser beams 51, however, the absorptance is higher and heat treatment can be efficient by making use of heat conduction from the irradiated film pattern to the surroundings.

This is also applicable to a material high in transmittance without being limited to an example where a material for membrane portion 17 is completely transparent.

Embodiment 3

Figure 14:
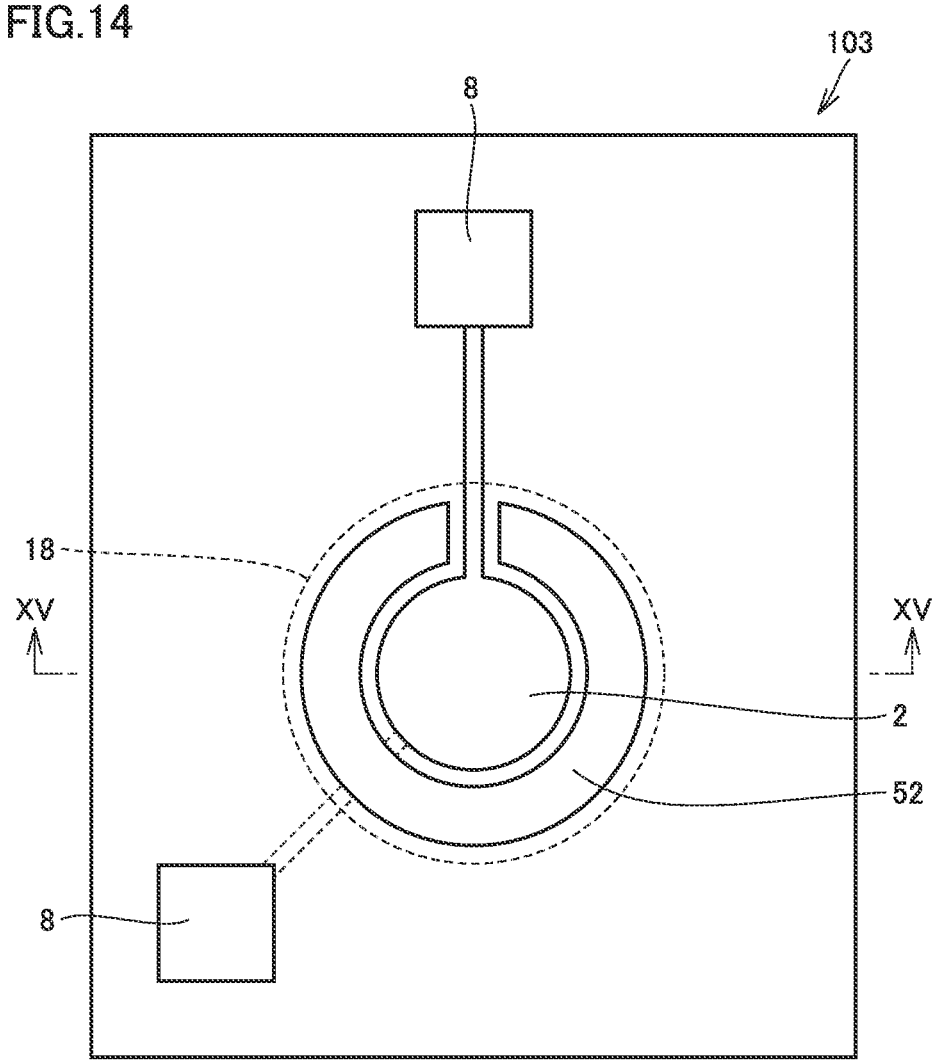
FIG. 14 is a plan view of a piezoelectric device manufactured with a method for manufacturing a piezoelectric device in yet another exemplary embodiment 3.
Figure 15:
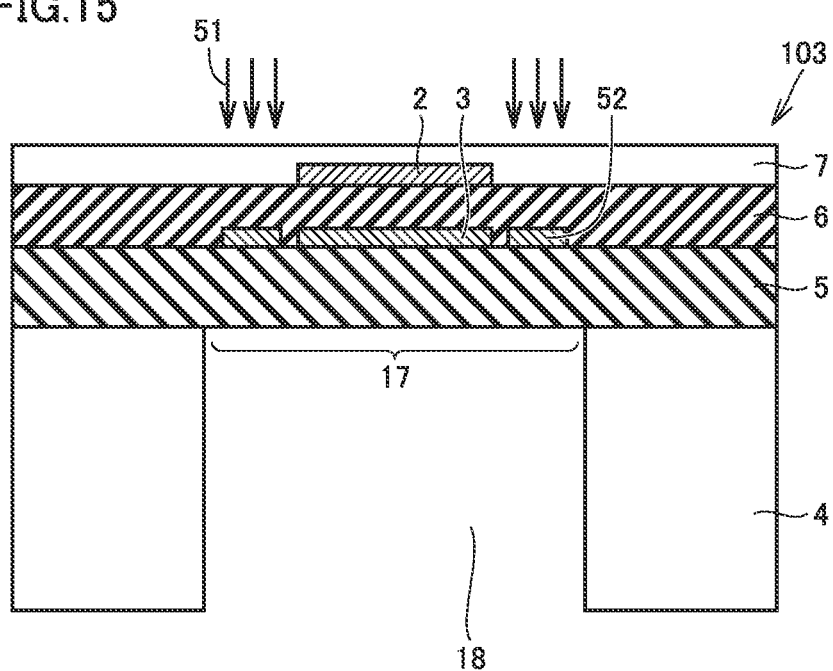
FIG. 15 is a cross-sectional view along the line XV-XV in FIG. 14.

A method for manufacturing a piezoelectric device in Embodiment 3 will be described with reference to FIGS. 14 and 15. A flowchart of the method for manufacturing a piezoelectric device in the present embodiment is the same as in FIG. 1. FIGS. 14 and 15 show one example of a piezoelectric device manufactured with the method for manufacturing a piezoelectric device in the present embodiment. FIG. 14 is a plan view of a piezoelectric device 103 and FIG. 15 is a cross-sectional view along the line XV-XV in FIG. 14. Though the method for manufacturing a piezoelectric device in the present embodiment is basically the same as described in Embodiment 1, it is different in points below.

In the present embodiment, in step S1 of forming the vibration portion, a light reception portion 52 for receiving laser beams 51 is formed in membrane portion 17 as the vibration portion and laser beams 51 are emitted toward light reception portion 52 in irradiation with laser beams 51.

When there is a region in the vibration portion which is less likely to absorb laser beams 51, in that state, temperature increase resulting from laser beams is not sufficient and heat treatment may locally be insufficient. As shown in the present embodiment, however, an absorptance of laser beams 51 can be enhanced by supplementary providing of light reception portion 52 so that heat treatment of the vibration portion can be more uniform. Since light reception portion 52 serves to receive laser beams and convert them into heat, it is preferably formed of a material high in light absorptance. Though light reception portion 52 does not have to be electrically conductive, it may be formed by patterning a conductor film simultaneously with formation of an electrode pattern.

Light reception portion 52 shown in the present embodiment is merely by way of example and the number, a position, a size, and a shape of light reception portion is not limited as shown here. The light reception portion may be in another shape. The light reception portion may be divided into a plurality of sections. The light reception portion may be arranged such that a part of the light reception portion extends off the vibration portion.

According to the method for manufacturing a piezoelectric device in each embodiment described above, a desired location can be subjected to local heat treatment to a desired extent as described above and therefore frequency variation can be lessened.

In heating the vibration portion to 900° C. or higher, in order to prevent oxidation of an AlN film, heating is preferably performed in an $N_2$ atmosphere, which is applicable also to any embodiment described above. Even in heating to 900° C. or higher, piezoelectric performance is not impaired because AlN and Mo are close to each other in linear coefficient of expansion, AlN and Mo have an extremely high melting point, and an AlN film has an extremely high Curie temperature not lower than 1000° C. Therefore, performance as a pMUT is not impaired. By bringing a ratio of a thickness between a piezoelectric film and a support film as close as possible to 1:1, deformation or destruction of membrane portion 17 due to a thermal stress can be suppressed.

Though an example in which an AlN film is employed as piezoelectric layer 6 is shown in each embodiment above, piezoelectric layer 6 is not limited to the AlN film. Piezoelectric layer 6 may be formed, for example, from a ZnO film or an AlN film doped with Sc.

Piezoelectric layer 6 is preferably mainly composed of any selected from the group consisting of AlN, KNN, and PZT. Thus, a piezoelectric device high in piezoelectric characteristics and excellent in performance can be obtained.

Though each embodiment above shows an example in which heater 1 is arranged on the upper surface of support layer 5, limitation to the configuration is not intended. Heater 1 may be arranged on an upper surface of piezoelectric layer 6.

A material for support layer 5 and protective film 7 is not limited to AlN and a material close in linear coefficient of expansion to AlN may be employed. A material for support layer 5 and protective film 7 may be, for example, silicon or SiN. When piezoelectric layer 6 is composed of KNN or PZT, support layer 5 may be composed of KNN or PZT.

A plurality of piezoelectric devices are normally simultaneously manufactured. In this case, a process proceeds concurrently for a plurality of piezoelectric devices. Conventionally, a resonance frequency may be varied also among the plurality of concurrently treated and manufactured piezoelectric devices. In each embodiment above, however, energy under the same condition is applied in unison as being aimed at vibration portions of the plurality of piezoelectric devices, and hence heat treatment is performed at once under the same condition. Frequency variation among the plurality of simultaneously manufactured piezoelectric devices can thus be suppressed.

Embodiment 4

Since electric power feed to the heater provided in the vibration portion or irradiation of the vibration portion with laser beams can be performed also on individual piezoelectric devices, frequency variation can also be suppressed by repeating a cycle of measurement of a resonance frequency heat treatment measurement of a resonance frequency heat treatment . . . at a room temperature in order to obtain a desired frequency in the individual piezoelectric devices. By adopting such a method, a plurality of piezoelectric devices among which frequency variation is less can be formed in a short period of time.

Figure 16:
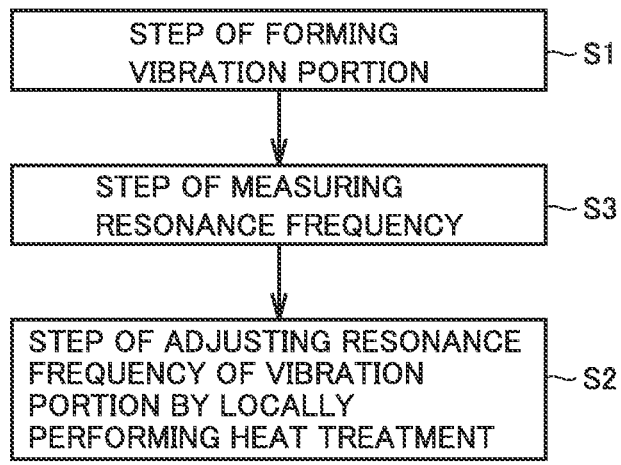
FIG. 16 is a flowchart of a method for manufacturing a piezoelectric device in yet another exemplary embodiment 4.

A method for manufacturing a piezoelectric device in Embodiment 4 will be described with reference to FIG. 16. FIG. 16 shows a flowchart of a method for manufacturing a piezoelectric device in the present embodiment. Though the method for manufacturing a piezoelectric device in the present embodiment is basically the same as described in Embodiment 1, it is different in points below.

The method for manufacturing a piezoelectric device in the present embodiment includes a step S3 of measuring a resonance frequency of the vibration portion and heat treatment in step S2 is performed based on a result of measurement in step S3 of measuring a resonance frequency.

Since information on a result of actual measurement can be used in the present embodiment, the heater can be driven in a more appropriate condition.

Embodiment 5

Figure 17:
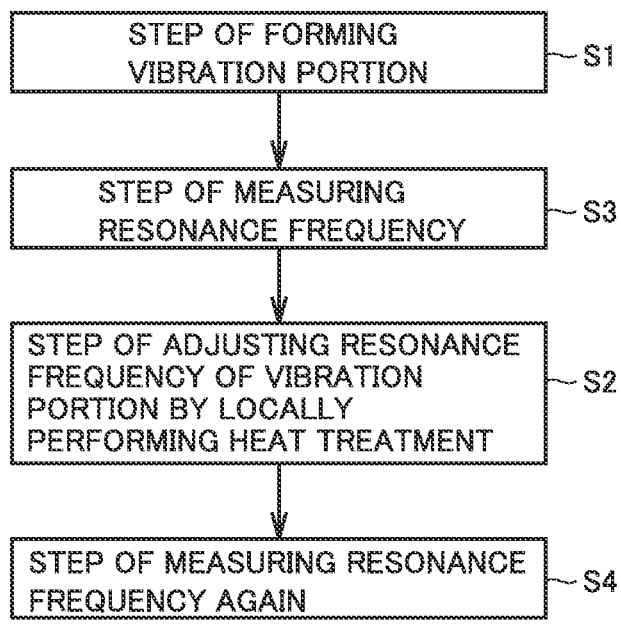
FIG. 17 is a flowchart of a method for manufacturing a piezoelectric device in another exemplary embodiment 5.

A method for manufacturing a piezoelectric device in Embodiment 5 will be described with reference to FIG. 17. FIG. 17 shows a flowchart of a method for manufacturing a piezoelectric device in the present embodiment. Though the method for manufacturing a piezoelectric device in the present embodiment is basically the same as described in Embodiment 4, it is different in points below.

The method for manufacturing a piezoelectric device in the present embodiment includes a step S4 of measuring a resonance frequency again after step S2 of adjusting a resonance frequency.

In the present embodiment, a resonance frequency changed by heat treatment in step S2 can be known so that whether or not the resonance frequency has attained to a desired value can be checked. When heat treatment is further repeated, the heat treatment can be performed in a more appropriate condition by using information on a value of the resonance frequency after the previous heat treatment.

By thus repeating the step of heat treatment and the step of measuring a resonance frequency, a resonance frequency of a piezoelectric device can be adjusted to a desired frequency.

Figure 18:
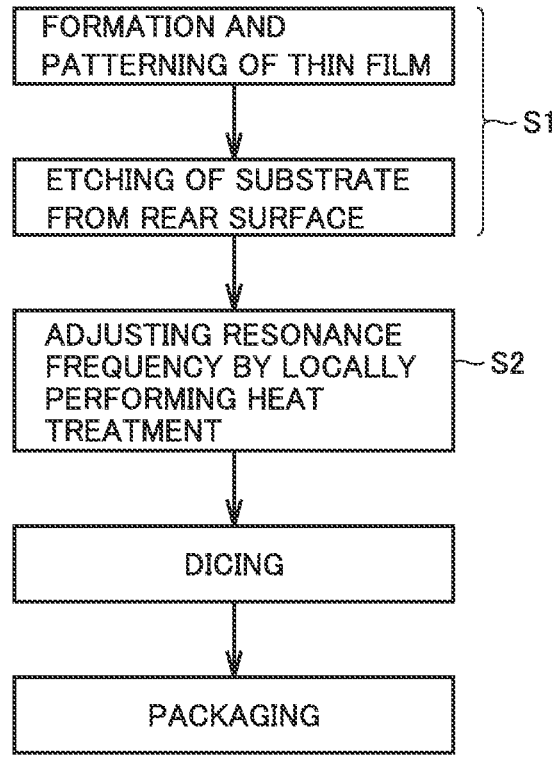
FIG. 18 shows a first example of a flowchart including a step of adjusting a resonance frequency by performing heat treatment.
Figure 19:
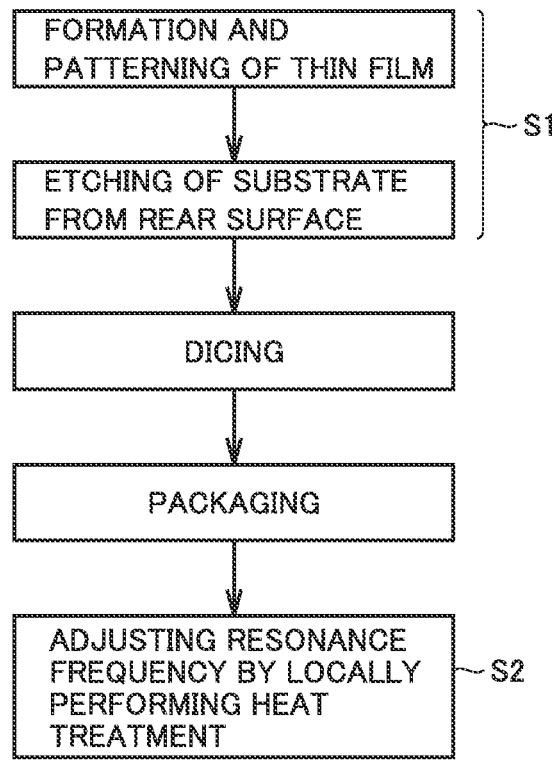
FIG. 19 shows a second example of a flowchart including the step of adjusting a resonance frequency by performing heat treatment.

Though step S2 of thus adjusting a resonance frequency by locally performing heat treatment may be performed after a step of etching a substrate and before dicing as shown in FIG. 18, it may be performed after a packaging step is completed as shown in FIG. 19. "Formation and patterning of thin film" in FIGS. 18 and 19 means that a structure on substrate 4 is obtained by repeating film formation and patterning. "Etching of substrate" means a step of providing through hole 18 by etching substrate 4 from the rear surface to thereby form membrane portion 17. "Dicing" means a step of division into individual piezoelectric devices in an example of fabrication of a plurality of piezoelectric devices on one large substrate.

Combination of the two steps above in FIG. 18 corresponds to step S1 of forming a vibration portion, which is also applicable to FIG. 19.

Embodiment 6

A method for manufacturing a piezoelectric device in Embodiment 6 will be described with reference again to FIGS. 2 and 3. Though a structure itself of the piezoelectric device in the present embodiment is the same as described in Embodiment 1, a material is mainly different. The reference numerals in FIGS. 2 and 3 are used in the text.

In the present embodiment, a perovskite ferroelectric such as potassium sodium niobate (KNN: (K, Na)NbO$_3$) or lead zirconate titanate (PZT: Pb(Zr, Ti)O$_3$) is used as a material for piezoelectric layer 6. In the present embodiment, a silicon on insulator (SOI) substrate is used as a component forming substrate 4 and support layer 5. The SOI substrate is structured such that a silicon layer, an oxide film, and an active layer are successively stacked from below. The active layer is composed of silicon.

In the present embodiment, the active layer of the SOI substrate is used as support layer 5. The active layer composed of Si has a thickness not smaller than 2 μm and not greater than 10 μm. A lower electrode formed from a stack film of Pt/Ti is formed on the SOI substrate to approximately 100 nm and patterned to form heater 1 and drive-and-reception lower electrode 3. On these elements, a PZT film is formed to a thickness of 1000 nm to 3000 nm through sputtering at a substrate temperature around 600° C. On this element, an upper electrode composed of Pt/Ti is formed. Since Pt is resistant to oxidation, a protective film is not particularly required. Though piezoelectric device 101 shown in FIG. 3 is provided with protective film 7, the piezoelectric device in the present embodiment is not provided with protective film 7. When a Pt film included in the upper electrode and a PZT film are formed with the sputtering method, the SOI substrate will have a great in-plane stress distribution for reasons the same as those for AlN. Even though a PZT film is formed with other techniques such as a sol-gel method as well, the SOI substrate will have an in-plane distribution of a firing temperature and hence will have a stress distribution.

In succession, the silicon layer of the SOI substrate is etched from the rear surface until the oxide film is reached. Thereafter, the oxide film is removed as necessary. The vibration portion in a form of a membrane is thus formed.

Thereafter, the vibration portion is subjected to local heat treatment by feeding electric power to heater 1 formed from the stack film of Pt/Ti. In this case, heat treatment is preferably performed at a temperature approximately not lower than 700° C. and not higher than 900° C. which is a temperature not lower than a film formation temperature. Since a temperature for heat treatment exceeds a Curie point, polarization treatment is required for use as a pMUT. Then, polarization treatment for aligning orientations of polarization of piezoelectric layer 6 is performed by applying an appropriate voltage across the electrodes formed for driving and reception on upper and lower surfaces of piezoelectric layer 6.

The present embodiment can also obtain an effect the same as in Embodiment 1. Since a material higher in piezoelectric characteristics than AlN is employed in the present embodiment, a piezoelectric device with good piezoelectric characteristics can be obtained.

Though heater 1 is provided and the vibration portion is subjected to local heat treatment by feeding electric power to heater 1 in the present embodiment, instead of providing the heater, heat treatment may be performed with a method of irradiation with laser beams as described in Embodiment 2.

(Applications Other than pMUT)

Though description is given in the embodiments above on the premise that a piezoelectric device is used as a pMUT, applications of the piezoelectric device are not limited to the pMUT. A technique for adjusting a resonance frequency can be used also in applications of a piezoelectric device as an RF filter and a MEMS oscillator.

(Modification of Structure of pMUT)

Though a pMUT configured such that heater 1 is arranged around an outer peripheral portion of membrane portion 17 is shown in the embodiments above, a piezoelectric device as the pMUT may also be configured otherwise, which will be described as Embodiments 7 to 10 below.

Embodiment 7

Figure 20:
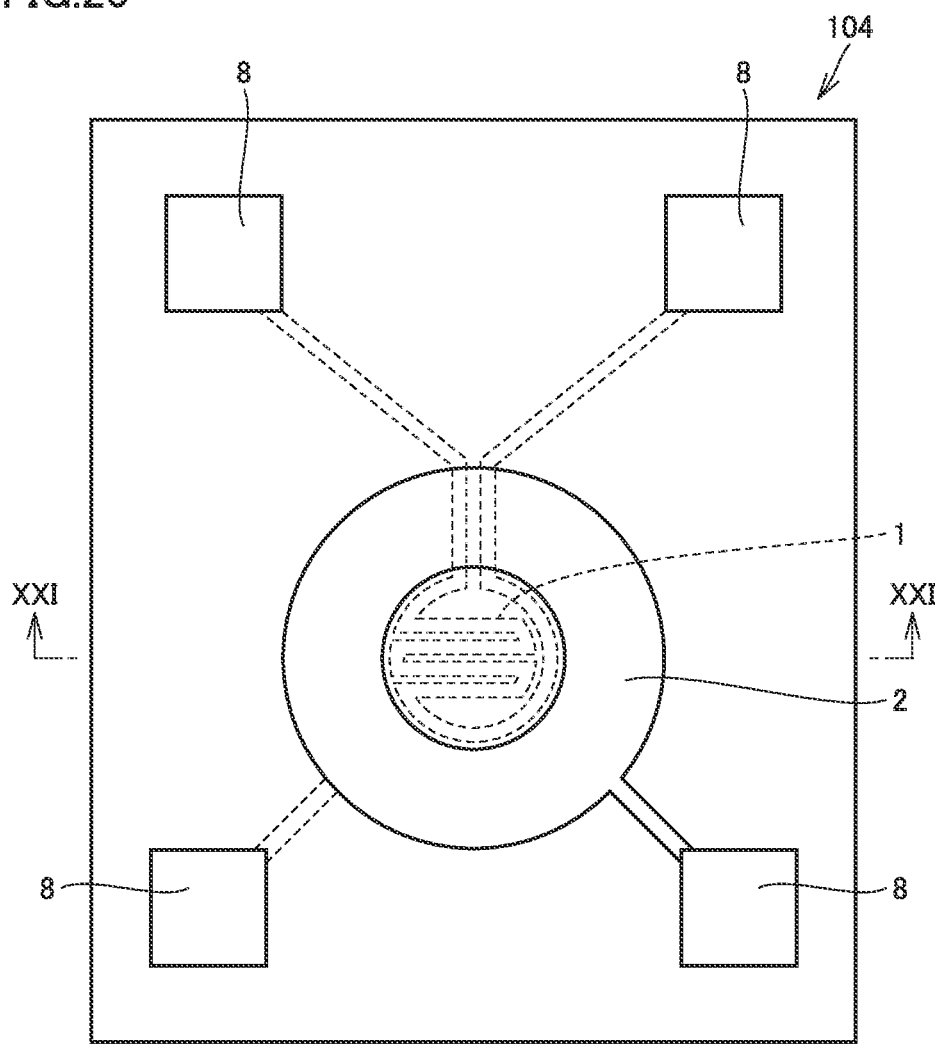
FIG. 20 is a plan view of a piezoelectric device manufactured with a method for manufacturing a piezoelectric device in another exemplary embodiment 7.
Figure 21:
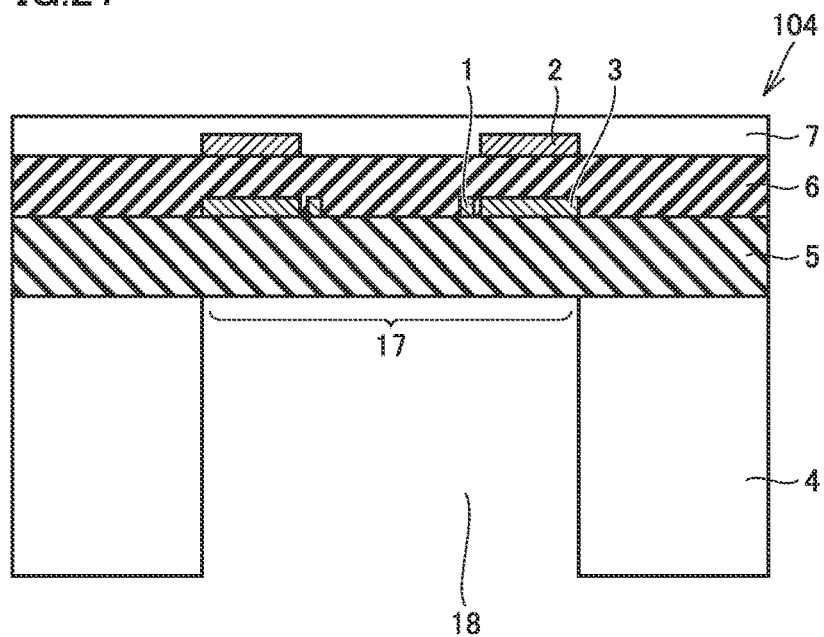
FIG. 21 is a cross-sectional view along the line XXI-XXI in FIG. 20.

A method for manufacturing a piezoelectric device in Embodiment 7 will be described with reference to FIGS. 20 and 21. FIGS. 20 and 21 show one example of a piezoelectric device manufactured with a method for manufacturing a piezoelectric device in the present embodiment. FIG. 20 is a plan view of a piezoelectric device 104 and FIG. 21 is a cross-sectional view along the line XXI-XXI in FIG. 20.

For the sake of convenience of description, FIG. 20 shows a state with protective film 7 having been removed. Even while protective film 7 is provided, protective film 7 is provided with an opening over each pad portion 8 and electrical connection to pad portion 8 can be established even from above protective film 7. This is also applicable to Embodiments 8 to 10.

Piezoelectric device 104 is manufactured in the present embodiment. In piezoelectric device 104, as shown in FIG. 21, drive-and-reception upper electrode 2 and drive-and-reception lower electrode 3 are arranged to sandwich piezoelectric layer 6 around the outer peripheral portion of membrane portion 17. Moreover, heater 1 is arranged on the upper surface of support layer 5 in a central portion of membrane portion 17 as being surrounded by these electrodes. Heater 1 includes a meandering portion. In piezoelectric device 104, membrane portion 17 serves as the vibration portion.

The method for manufacturing a piezoelectric device in the embodiments described above can be adopted also in manufacturing a piezoelectric device as the thus configured pMUT. Local heat treatment of membrane portion 17 as the vibration portion can be performed by feeding electric power to heater 1 and frequency variation can be lessened.

Embodiment 8

Figure 22:
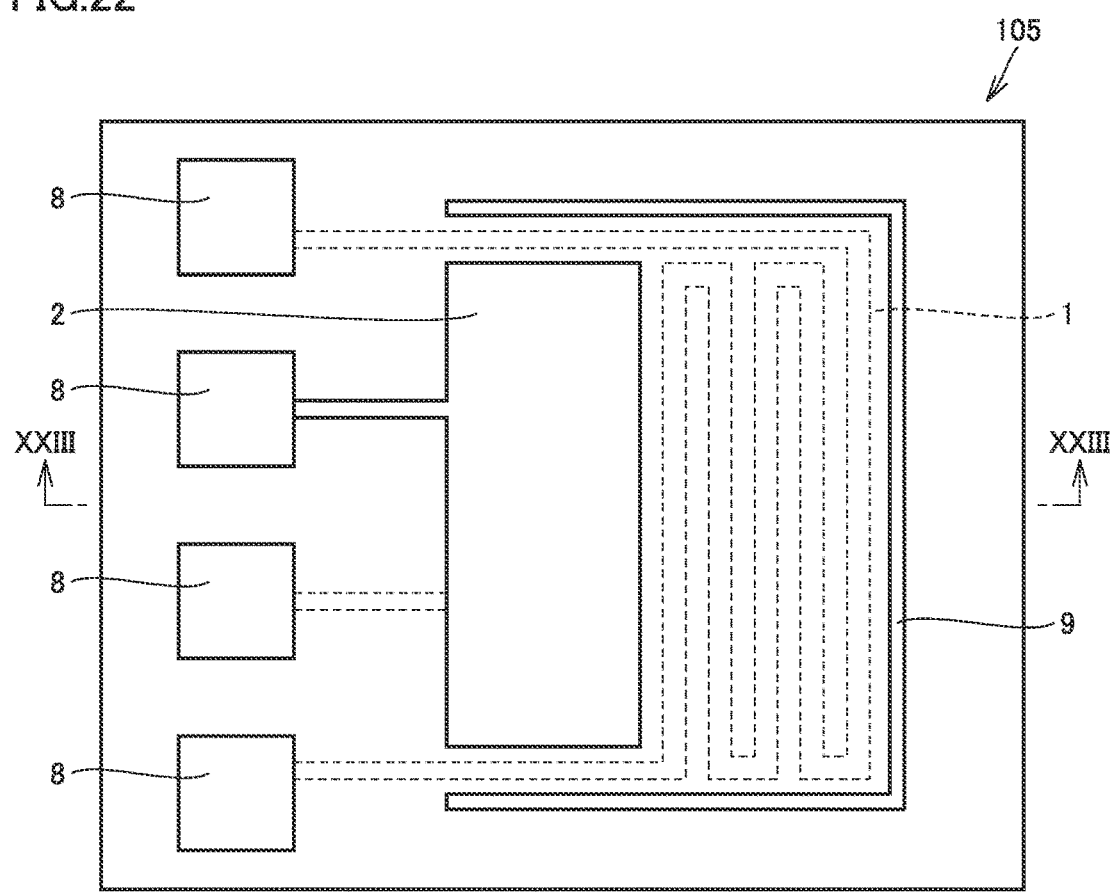
FIG. 22 is a plan view of a piezoelectric device manufactured with a method for manufacturing a piezoelectric device in another exemplary embodiment 8.
Figure 23:
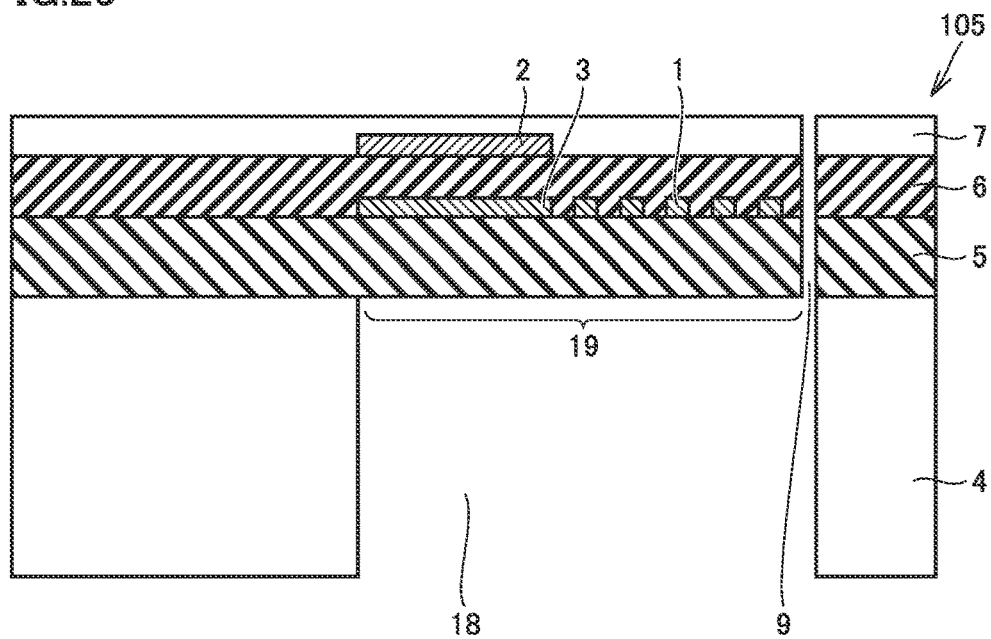
FIG. 23 is a cross-sectional view along the line XXIII-XXIII in FIG. 22.

A method for manufacturing a piezoelectric device in Embodiment 8 will be described with reference to FIGS. 22 and 23. FIGS. 22 and 23 show one example of a piezoelectric device manufactured with a method for manufacturing a piezoelectric device in the present embodiment. FIG. 22 is a plan view of a piezoelectric device 105 and FIG. 23 is a cross-sectional view along the line XXIII-XXIII in FIG. 22.

Piezoelectric device 105 is manufactured in the present embodiment. In piezoelectric device 105, as shown in FIG. 22, a slit 9 is provided to provide a cantilever structure. Drive-and-reception upper electrode 2 and drive-and-reception lower electrode 3 are arranged to sandwich piezoelectric layer 6 in a portion on a root side of a cantilever portion 19. Heater 1 is arranged on the upper surface of support layer 5 in a portion on a tip end side of cantilever portion 19. Heater 1 includes a meandering portion. In piezoelectric device 105, cantilever portion 19 serves as the vibration portion. In the piezoelectric device having the cantilever structure, the cantilever portion is supported only in the portion on the root side. Therefore, a stress in the cantilever portion is released and frequency variation is generally less. The cantilever portion, however, may warp upward or downward or a degree of deformation may be different in the cantilever portion.

The method for manufacturing a piezoelectric device in the embodiments described above can be adopted also in manufacturing a piezoelectric device as the pMUT configured as described in the present embodiment. Local heat treatment of cantilever portion 19 as the vibration portion can be performed by feeding electric power to heater 1 and a degree of deformation can be lessened. As the degree of deformation is lessened, frequency variation can be lessened.

Embodiment 9

Figure 24:
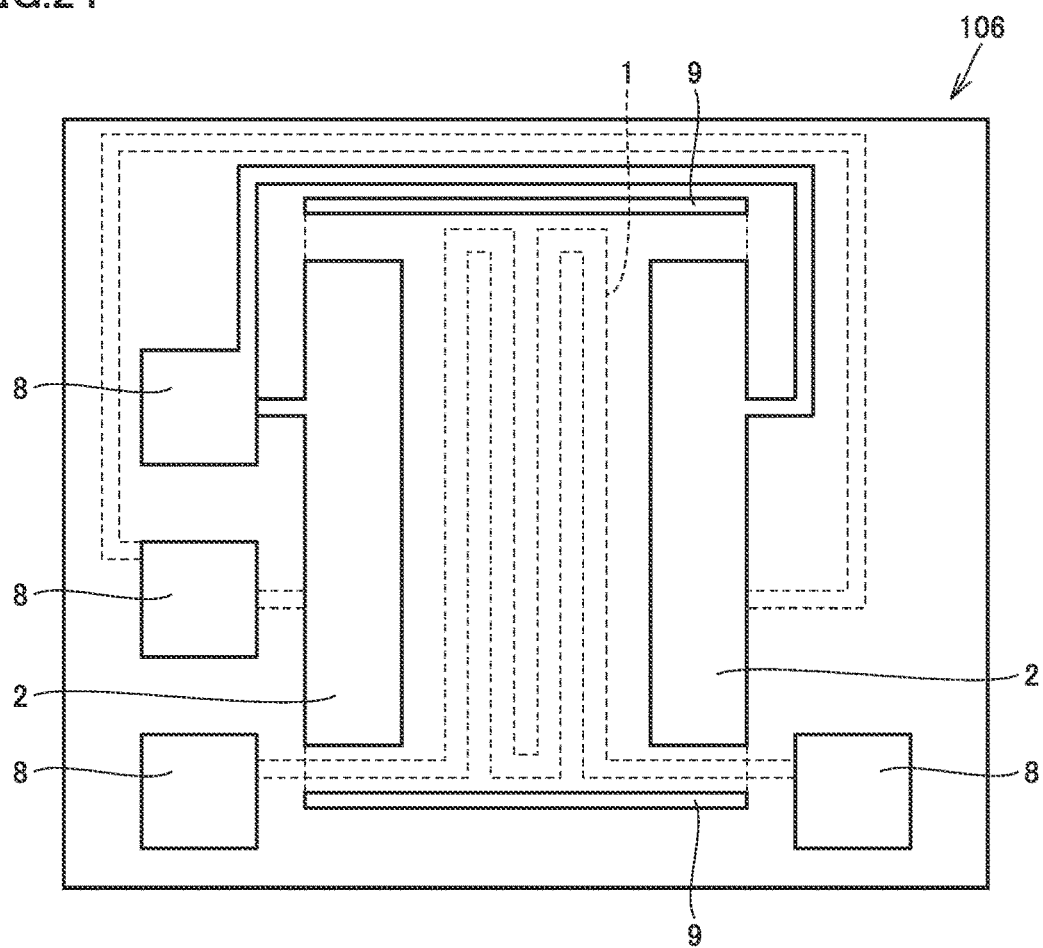
FIG. 24 is a plan view of a piezoelectric device manufactured with a method for manufacturing a piezoelectric device in another exemplary embodiment 9.

A method for manufacturing a piezoelectric device in Embodiment 9 will be described with reference to FIG. 24. FIG. 24 shows one example of a piezoelectric device manufactured with a method for manufacturing a piezoelectric device in the present embodiment. FIG. 24 is a plan view of a piezoelectric device 106.

Piezoelectric device 106 is manufactured in the present embodiment. In piezoelectric device 106, as shown in FIG. 24, two slits 9 are provided in parallel so that a double-supported beam structure is provided. Drive-and-reception upper electrode 2 and drive-and-reception lower electrode 3 are arranged to sandwich piezoelectric layer 6 in portions on root sides of a double-supported beam portion, that is, in a left end portion and a right end portion in FIG. 24. Heater 1 is arranged on the upper surface of support layer 5 in a central portion of the double-supported beam portion. Heater 1 includes a meandering portion. In piezoelectric device 106, the double-supported beam portion serves as the vibration portion.

The method for manufacturing a piezoelectric device in the embodiments described above can be adopted also in manufacturing a piezoelectric device as the thus configured pMUT. Local heat treatment of the double-supported beam portion as the vibration portion can be performed by feeding electric power to heater 1 and frequency variation can be lessened.

Embodiment 10

Figure 25:
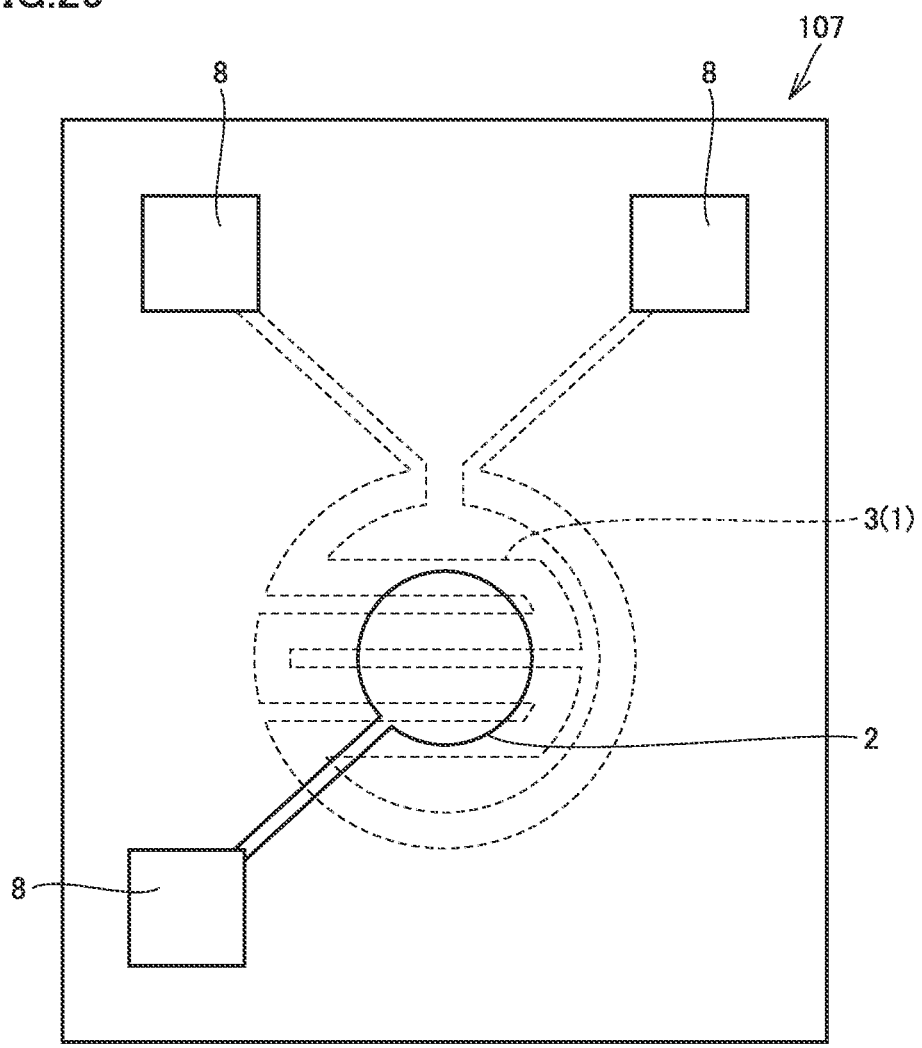
FIG. 25 is a plan view of a piezoelectric device manufactured with a method for manufacturing a piezoelectric device in another exemplary embodiment 10.

A method for manufacturing a piezoelectric device in Embodiment 10 will be described with reference to FIG. 25. FIG. 25 shows one example of a piezoelectric device manufactured with a method for manufacturing a piezoelectric device in the present embodiment. FIG. 25 is a plan view of a piezoelectric device 107.

Piezoelectric device 107 is manufactured in the present embodiment. Piezoelectric device 107 includes a membrane portion the same as shown in Embodiment 1. In piezoelectric device 107, this membrane portion serves as the vibration portion. In piezoelectric device 107, as shown in FIG. 25, a wire formed as meandering on the upper surface of support layer 5 in the membrane portion serves as heater 1 and drive-and-reception lower electrode 3. Drive-and-reception upper electrode 2 is arranged as being superimposed on such an element serving as both of heater 1 and drive-and-reception lower electrode 3. Piezoelectric layer 6 lies between drive-and-reception upper electrode 2 and drive-and-reception lower electrode 3.

The method for manufacturing a piezoelectric device in the embodiments described above can be adopted also in manufacturing a piezoelectric device as the thus configured pMUT. Local heat treatment of the membrane portion as the vibration portion can be performed by feeding electric power to heater 1 and frequency variation can be lessened.

Though Embodiments 7 to 10 are described as providing heater 1 and subjecting the vibration portion to local heat treatment by feeding electric power to heater 1, it should be appreciated that a method of heat treatment of the vibration portion is not limited as such and the vibration portion may be irradiated with laser beams as described above in Embodiment 2. With such a method as well, desired local heat treatment can be performed. When a region including at least a part of the vibration portion is subjected to local heat treatment by irradiation with laser beams, it is not necessarily required to provide a heater in advance in the vibration portion.

The lower electrode and the upper electrode in each embodiment described above are preferably mainly composed of W or MO. By doing so, since the lower electrode and the upper electrode are resistant even to a high temperature exceeding 900° C., such a high temperature can be used in local heat treatment of the vibration portion for adjusting a resonance frequency. Therefore, the resonance frequency can be adjusted in a short period of time.

In each embodiment described above, protective film 7 is preferably mainly composed of any selected from the group consisting of AlN, Si, and SiN. By doing so, since protective film 7 is resistant even to a high temperature exceeding 900° C., such a high temperature can be used in local heat treatment of the vibration portion for adjusting a resonance frequency. Therefore, the resonance frequency can be adjusted in a short period of time.

In each embodiment described above, support layer 5 is preferably mainly composed of any selected from the group consisting of AlN, Si, and SiN. By doing so, since support layer 5 is resistant even to a high temperature exceeding 900° C., such a high temperature can be used in local heat treatment of the vibration portion for adjusting a resonance frequency. Therefore, the resonance frequency can be adjusted in a short period of time.

Embodiment 11

A method for manufacturing a piezoelectric device in Embodiment 11 will be described with reference to FIGS. 26 and 27. FIG. 27 is a cross-sectional view along the line XXVII-XXVII in FIG. 26.

Figure 26:
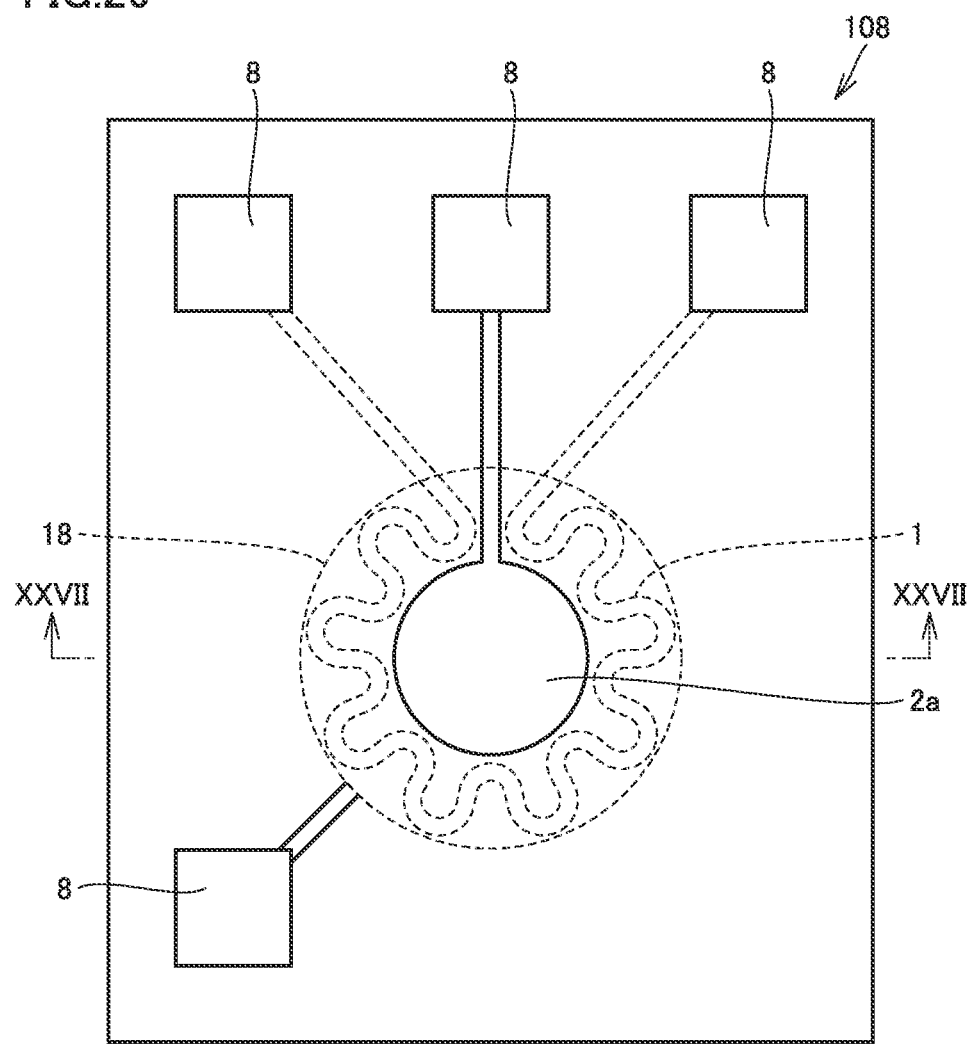
FIG. 26 is a plan view of a piezoelectric device manufactured with a method for manufacturing a piezoelectric device in another exemplary embodiment 11.
Figure 27:
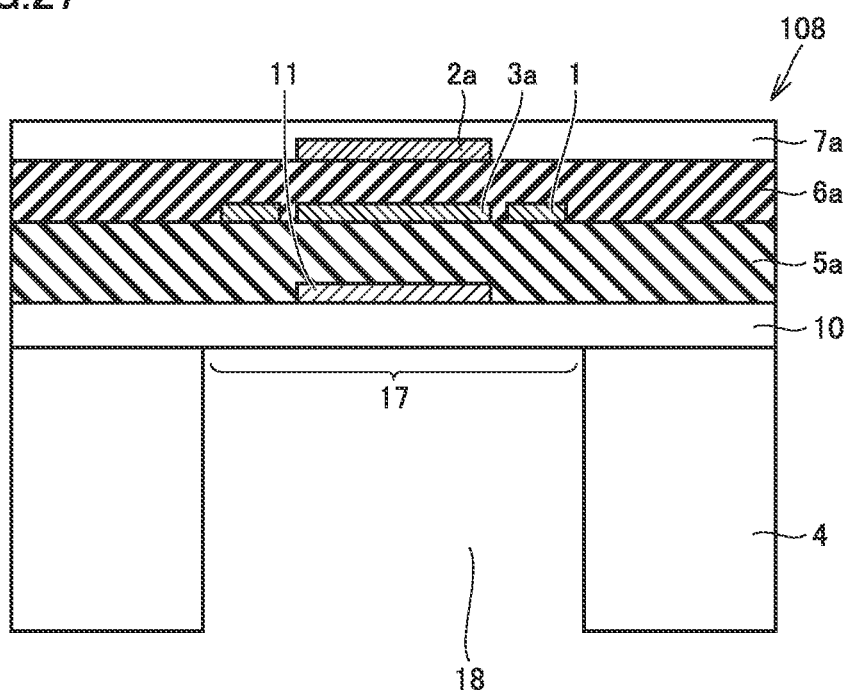
FIG. 27 is a cross-sectional view along the line XXVII-XXVII in FIG. 26.

For the sake of convenience of description, FIG. 26 shows a state with protective film 7 having been removed. Even while protective film 7 is provided, protective film 7 is provided with an opening over each pad portion 8 and electrical connection to pad portion 8 can be established even from above protective film 7. This is also applicable to Embodiments 12 and 13.

A piezoelectric device 108 is manufactured in the present embodiment. Though piezoelectric device 108 is similar to piezoelectric device 101 shown in Embodiment 1, it has a bimorph structure unlike piezoelectric device 101. In piezoelectric device 108, a piezoelectric film has a two-layered structure and an electrode has a three-layered structure so as to be able to individually apply a voltage to each of these piezoelectric films. As shown in the cross-sectional view in FIG. 27, piezoelectric device 108 includes a first piezoelectric film 6a and a second piezoelectric film 5a as two piezoelectric films. As shown, piezoelectric device 108 includes a drive-and-reception first electrode 2a, a drive-and-reception second electrode 3a, and a drive-and-reception third electrode 11 as three electrodes. These three electrodes occupy substantially the same area when viewed two-dimensionally. These three electrodes are spaced apart from one another in a direction of thickness.

Piezoelectric device 108 includes on substrate 4, a lower protective film 10, second piezoelectric film 5a, first piezoelectric film 6a, and an upper protective film 7a in this order. Drive-and-reception third electrode 11 is arranged between lower protective film 10 and second piezoelectric film 5a. Drive-and-reception third electrode 11 is formed on an upper surface of lower protective film 10. Drive-and-reception second electrode 3a and heater 1 are arranged between second piezoelectric film 5a and first piezoelectric film 6a. These are formed on an upper surface of second piezoelectric film 5a. Drive-and-reception first electrode 2a is arranged between first piezoelectric film 6a and upper protective film 7a. Drive-and-reception first electrode 2a is formed on an upper surface of first piezoelectric film 6a.

A lowermost surface of a portion exposed as membrane portion 17 is covered with lower protective film 10.

The method for manufacturing a piezoelectric device in the embodiments described above can be adopted also in manufacturing piezoelectric device 108 as the thus configured pMUT. Heat treatment of membrane portion 17 can be performed by feeding electric power to heater 1 and frequency variation can be lessened.

Embodiment 12

Figure 28:
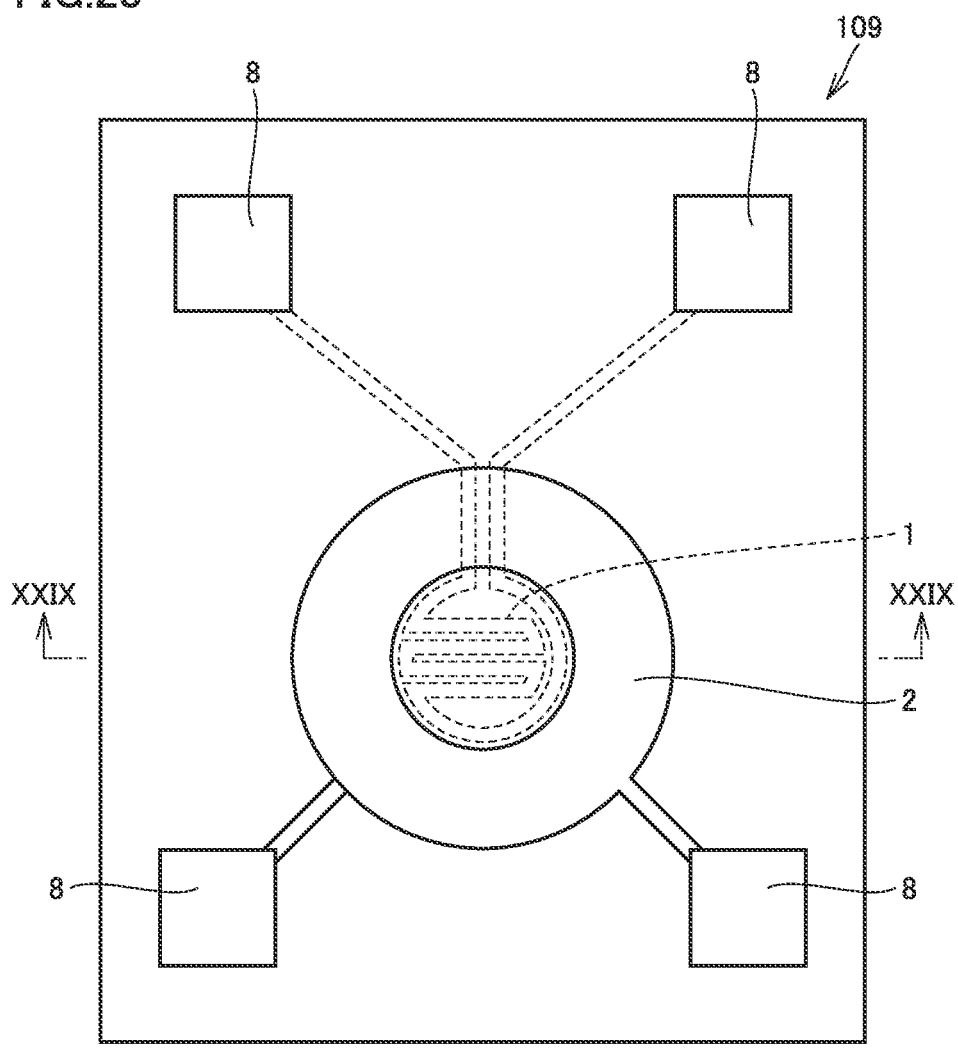
FIG. 28 is a plan view of a piezoelectric device manufactured with a method for manufacturing a piezoelectric device in another exemplary embodiment 12.
Figure 29:
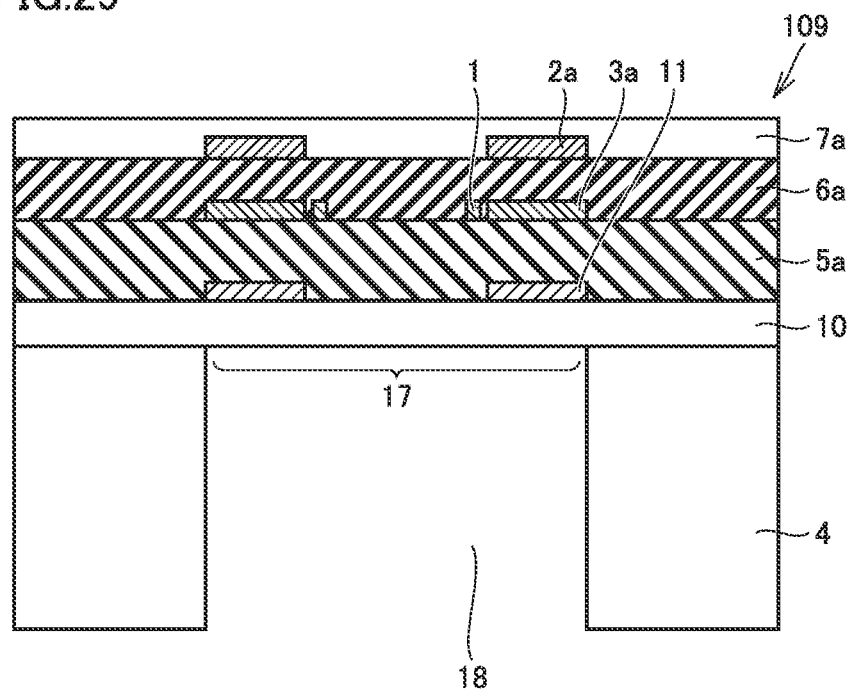
FIG. 29 is a cross-sectional view along the line XXIX-XXIX in FIG. 28.

A method for manufacturing a piezoelectric device in Embodiment 12 will be described with reference to FIGS. 28 and 29. FIG. 29 is a cross-sectional view along the line XXIX-XXIX in FIG. 28.

A piezoelectric device 109 is manufactured in the present embodiment. Though piezoelectric device 109 is similar to piezoelectric device 104 shown in Embodiment 7, it has a bimorph structure unlike piezoelectric device 104. Details of the bimorph structure are the same as described in Embodiment 11.

The method for manufacturing a piezoelectric device in the embodiments described above can be adopted also in manufacturing piezoelectric device 109 as the thus configured pMUT. Heat treatment of membrane portion 17 can be performed by feeding electric power to heater 1 and frequency variation can be lessened.

Embodiment 13

Figure 30:
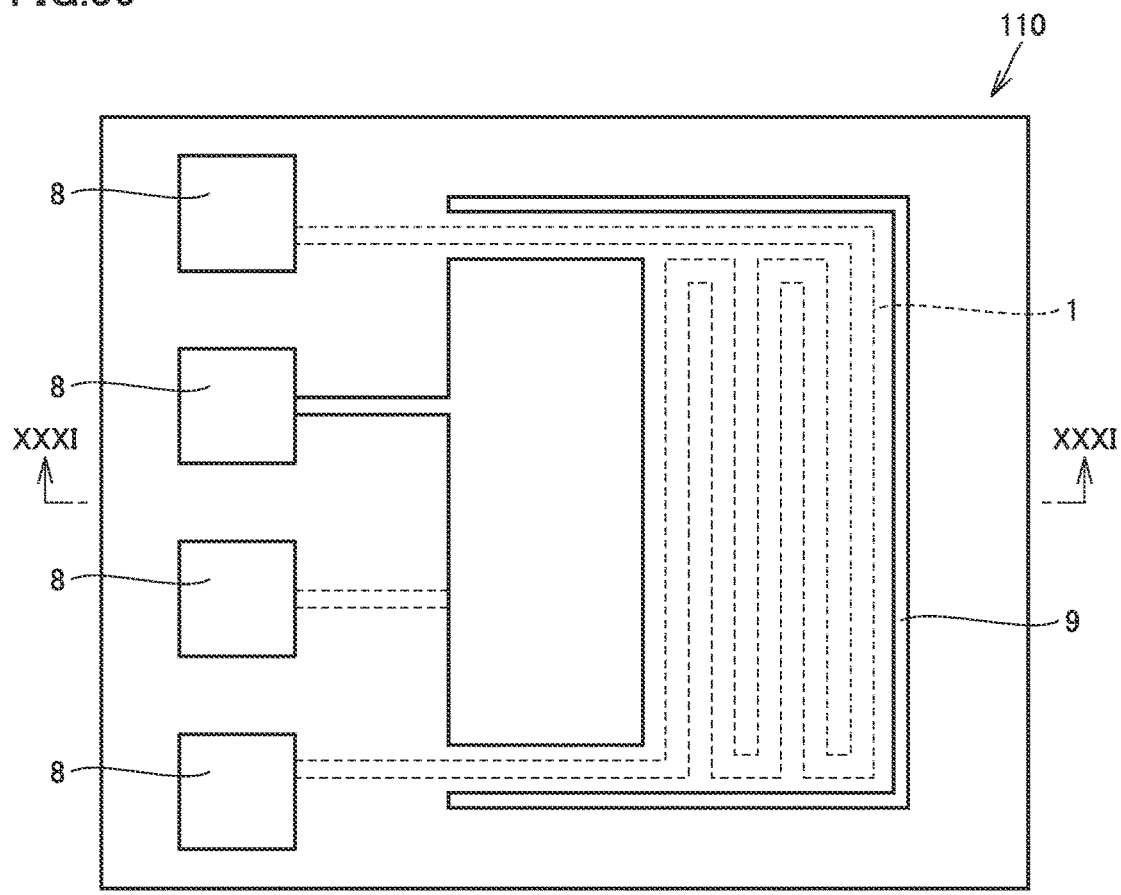
FIG. 30 is a plan view of a piezoelectric device manufactured with a method for manufacturing a piezoelectric device in another exemplary embodiment 13.
Figure 31:
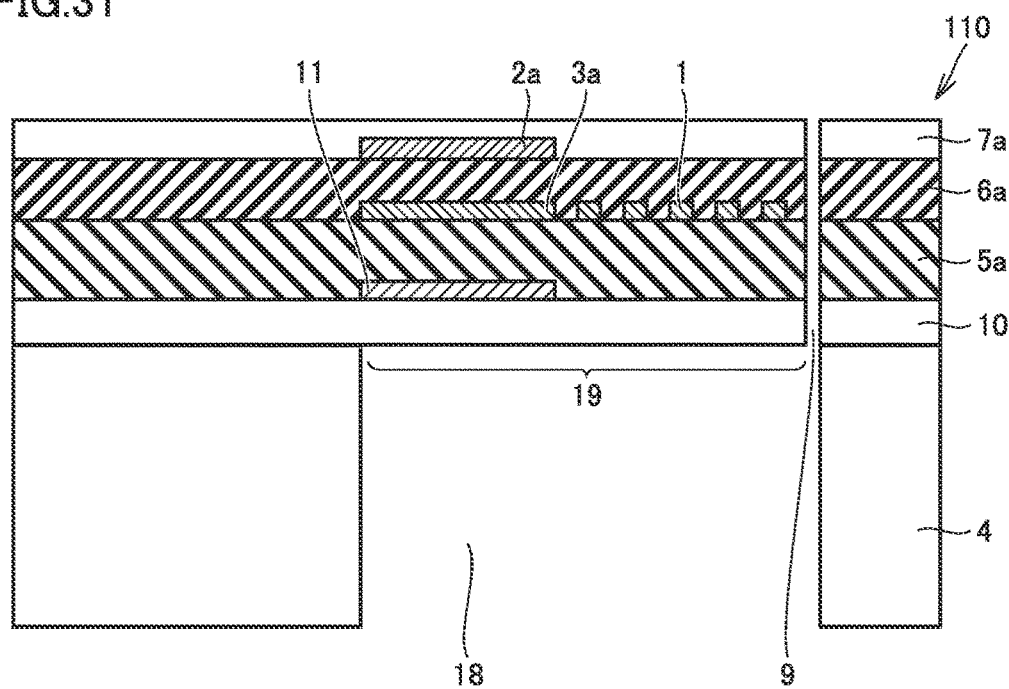
FIG. 31 is a cross-sectional view along the line XXXI-XXXI in FIG. 30.

A method for manufacturing a piezoelectric device in Embodiment 13 will be described with reference to FIGS. 30 and 31. FIG. 31 is a cross-sectional view along the line XXXI-XXXI in FIG. 30.

A piezoelectric device 110 is manufactured in the present embodiment. Though piezoelectric device 110 is similar to piezoelectric device 105 shown in Embodiment 8, it has a bimorph structure unlike piezoelectric device 105. Details of the bimorph structure are the same as described in Embodiment 11.

The method for manufacturing a piezoelectric device in the embodiments described above can be adopted also in manufacturing piezoelectric device 110 as the thus configured pMUT. Heat treatment of cantilever portion 19 can be performed by feeding electric power to heater 1 and frequency variation can be lessened.

A plurality of the embodiments may be adopted as being combined as appropriate.

The embodiments disclosed herein are illustrative and non-restrictive in every respect. The scope of the present disclosure is defined by the terms of the claims, rather than the description above, and is intended to include any modifications within the scope and meaning equivalent to the terms of the claims.

REFERENCE SIGNS LIST 1 heater; 2 drive-and-reception upper electrode; 2a drive-and-reception first electrode; 3 drive-and-reception lower electrode; 3a drive-and-reception second electrode; 4 substrate; 5 support layer; 5a second piezoelectric film; 6 piezoelectric layer; 6a first piezoelectric film; 7 protective film; 7a upper protective film; 8 pad portion; 9 slit; 10 lower protective film; 11 drive-and-reception third electrode; 17 membrane portion; 18 through hole; 19 cantilever portion; 51 laser beams; 52 light reception portion; 91 arrow; 101, 102, 103, 104, 105, 106, 107, 108, 109, 110 piezoelectric device

The invention claimed is:

1. A method for adjusting a frequency of a piezoelectric device that includes a substrate and a vibration portion supported by the substrate, the vibration portion including a piezoelectric layer that is supported by the substrate, the method comprising:
adjusting a resonance frequency of the vibration portion by locally subjecting a region of the piezoelectric device that includes at least a part of the vibration portion to a heat treatment;
wherein:
a through hole or a recess is located in the substrate;
the substrate includes a support layer that at least partially covers the through hole or the recess; and
the piezoelectric layer of the vibration portion is supported by the substrate with the support layer interposed therebetween.

2. The method for adjusting the frequency of a piezoelectric device according to claim 1, wherein the vibration portion is in a form of a membrane or a beam and is directly or indirectly supported by the substrate.

3. The method for adjusting the frequency of a piezoelectric device according to claim 1, further comprising adjusting a stress in the vibration portion through the heat treatment to adjust the resonance frequency of the vibration portion.

4. The method for adjusting the frequency of a piezoelectric device according to claim 1, wherein:
the vibration portion includes a residual stress displaced toward a tensile stress relative to a value for a residual stress corresponding to a target value for the resonance frequency; and
the residual stress in the vibration portion is modified during heat treatment toward a compressive stress to adjust the resonance frequency of the vibration portion.

5. The method for adjusting the frequency of a piezoelectric device according claim 1, wherein the vibration portion includes a heater and the resonance frequency of the vibration portion is adjusted by driving the heater.

6. The method for adjusting the frequency of a piezoelectric device according to claim 1, wherein the heat treatment comprises irradiating at least the part of the vibration portion with laser beams.

7. The method for adjusting the frequency of a piezoelectric device according to claim 6, wherein:
the vibration portion includes a light reception portion for receiving the laser beams; and
the laser beams are emitted toward the light reception portion to irradiate, and thereby heat, at least the part of the vibration portion.

8. The method for adjusting the frequency of a piezoelectric device according to claim 1, further comprising:
measuring the resonance frequency of the vibration portion; and
locally subjecting the region of the piezoelectric device to the heat treatment based on a result of the measuring of the resonance frequency.

9. The method for adjusting the frequency of a piezoelectric device according to claim 8, further comprising performing another measuring of the resonance frequency after the adjusting of the resonance frequency of the vibration portion.

10. The method for adjusting the frequency of a piezoelectric device according to claim 1, wherein:
opposed first and second electrodes sandwich the piezoelectric layer; and
a protective film covers both the first electrode and the piezoelectric layer.

11. The method for adjusting the frequency of a piezoelectric device according to claim 10, wherein the first and second electrodes comprise at least one of W and Mo.

12. The method for adjusting the frequency of a piezoelectric device according to claim 10, wherein the protective film comprises at least one of the group consisting of AlN, Si, and SiN.

13. The method for adjusting the frequency of a piezoelectric device according to claim 1, wherein the support layer comprises at least one of the group consisting of AlN, Si, and SiN.

14. The method for adjusting the frequency of a piezoelectric device according to claim 1, wherein the piezoelectric layer comprises at least one of the group consisting of AlN, KNN, and PZT.

15. A method for manufacturing a piezoelectric device, the method comprising:
forming a vibration portion on a substrate;
forming a first electrode on a surface of the vibration portion;
forming a heater on the surface of the vibration portion to surround the first electrode;
forming a piezoelectric layer on the surface of the vibration portion, the first electrode and the heater;
forming a second electrode on a surface of the piezoelectric layer opposite the support layer;
forming a protective film on the surface of the piezoelectric layer and the second electrode;
forming a through hole or recess in the substrate opposite the vibration portion to expose the vibration portion; and
applying a heat treatment to the heater to set a resonance frequency of the vibration portion.

16. The method for manufacturing a piezoelectric device according to claim 15, further comprising:
forming the vibration portion to include a residual stress displaced toward a tensile stress relative to a value for a residual stress corresponding to a target value for the resonance frequency, and
varying an amount of the residual stress in the vibration portion toward a compressive stress through the heat treatment to adjust the resonance frequency of the vibration portion.

17. The method for manufacturing a piezoelectric device according to claim 15, further comprising:
measuring the resonance frequency of the vibration portion; and
locally subjecting the region of the piezoelectric device to the heat treatment based on a result of the measuring of the resonance frequency.

18. The method for manufacturing a piezoelectric device according to claim 17, further comprising performing another measuring of the resonance frequency after the adjusting of the resonance frequency of the vibration portion.

19. The method for manufacturing a piezoelectric device according to claim 15, further comprising adjusting a stress in the vibration portion through the heat treatment to adjust the resonance frequency of the vibration portion.

20. A method for adjusting a frequency of a piezoelectric device that includes a substrate and a vibration portion supported by the substrate, the vibration portion including a piezoelectric layer that is supported by the substrate, the method comprising:
adjusting a resonance frequency of the vibration portion by locally subjecting a region of the piezoelectric device that includes at least a part of the vibration portion to a heat treatment, the adjusting including (a) measuring the resonance frequency of the vibration portion, and (b) locally subjecting the region of the piezoelectric device to the heat treatment based on a result of the measuring of the resonance frequency.

* * * * *